(12) United States Patent
Sugawara et al.

(10) Patent No.: US 6,717,202 B2
(45) Date of Patent: Apr. 6, 2004

(54) HSG SEMICONDUCTOR CAPACITOR WITH MIGRATION INHIBITION LAYER

(75) Inventors: Yasuhiro Sugawara, Akishima (JP); Ryouichi Furukawa, Ome (JP); Toshio Uemura, Niiza (JP); Akira Takamatsu, Hamura (JP); Hirohiko Yamamoto, Hachiouji (JP); Tadanori Yoshida, Sayama (JP); Masayuki Ishizaka, Kodaira (JP); Shinpei Iljima, Akishima (JP); Yuzuru Ohji, Hinode-machi (JP)

(73) Assignees: Renesas Technology Corp., Tokyo (JP); Hitachi ULSI Systems Co., Ltd., Tokyo (JP)

( * ) Notice: Subject to any disclaimer, the term of this patent is extended or adjusted under 35 U.S.C. 154(b) by 0 days.

(21) Appl. No.: 10/271,798

(22) Filed: Oct. 17, 2002

(65) Prior Publication Data

US 2003/0038325 A1 Feb. 27, 2003

Related U.S. Application Data

(62) Division of application No. 09/390,683, filed on Sep. 7, 1999, now Pat. No. 6,524,927.

(30) Foreign Application Priority Data

Sep. 4, 1998 (JP) ............................................ 10-251308

(51) Int. Cl.[7] ............................................. H01L 27/108
(52) U.S. Cl. ....................... 257/309; 438/255; 438/398
(58) Field of Search ........................ 257/309; 438/255, 438/398

(56) References Cited

U.S. PATENT DOCUMENTS

| 5,208,479 A | * | 5/1993 | Mathews et al. | 257/534 |
|---|---|---|---|---|
| 5,340,765 A | | 8/1994 | Dennison et al. | 438/398 |
| 5,418,180 A | | 5/1995 | Brown | 438/398 |
| 5,831,282 A | | 11/1998 | Nuttall | 257/64 |
| 5,885,869 A | * | 3/1999 | Turner et al. | 438/261 |
| 5,913,119 A | | 6/1999 | Lin et al. | 438/255 |
| 5,930,641 A | | 7/1999 | Pan | 438/398 |
| 5,937,314 A | | 8/1999 | Ping et al. | 438/486 |
| 5,959,326 A | | 9/1999 | Aiso et al. | 257/306 |
| 5,963,805 A | | 10/1999 | Kang et al. | 438/255 |

(List continued on next page.)

FOREIGN PATENT DOCUMENTS

| JP | 5-114712 | 5/1993 |
|---|---|---|
| JP | 5-175456 | 7/1993 |
| JP | 5-315566 | 11/1993 |
| JP | 6-204426 | 7/1994 |
| JP | 7-153916 | 6/1995 |
| JP | 9-213892 | 8/1997 |
| JP | 9-298284 | 11/1997 |
| JP | 10-56155 | 2/1998 |

OTHER PUBLICATIONS

Wolf et al., *Silicon Processing for the VLSI Era—Process Technology*, (Lattice Press, CA, 1986), pp. 179–180.*

Primary Examiner—Michael S. Lebentritt
Assistant Examiner—Christian D. Wilson
(74) Attorney, Agent, or Firm—Antonelli, Terry, Stout & Kraus, LLP

(57) ABSTRACT

A first silicon film is so formed as to extend along the inner surface of trenches 52 formed in a silicon oxide film 50, an oxide film is formed on the surface of the first silicon film, and a second amorphous silicon film is further deposited. Heat-treatment is applied to the surface of the second amorphous silicon film for seeding silicon nuclei and for promoting grain growth, and a granular silicon crystal 57 is grown from the second amorphous silicon film. In this way, the resistance of a lower electrode 59 of a capacitance device can be lowered.

25 Claims, 36 Drawing Sheets

U.S. PATENT DOCUMENTS

| | | | |
|---|---|---|---|
| 6,037,219 A | 3/2000 | Lin et al. | 438/255 |
| 6,046,082 A * | 4/2000 | Hirota | 438/255 |
| 6,046,083 A * | 4/2000 | Lin et al. | 438/255 |
| 6,090,679 A | 7/2000 | Lou | 438/396 |
| 6,143,605 A | 11/2000 | Lou | 438/255 |
| 6,146,967 A | 11/2000 | Thakur et al. | 438/398 |
| 6,207,523 B1 | 3/2001 | Parekh et al. | 438/396 |
| 6,258,691 B1 | 7/2001 | Kim | 438/398 |
| 2001/0026482 A1 * | 10/2001 | Sakai | 365/200 |
| 2002/0064915 A1 * | 5/2002 | Kitamura | 438/255 |

* cited by examiner

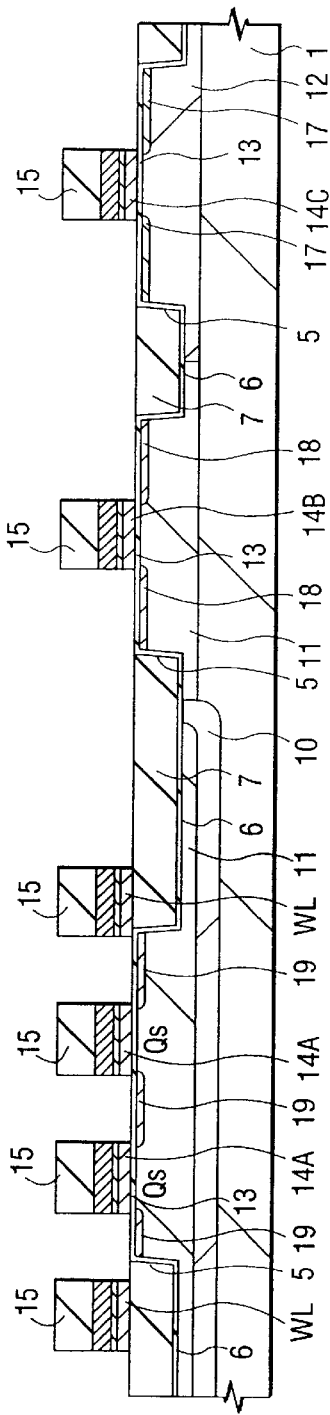
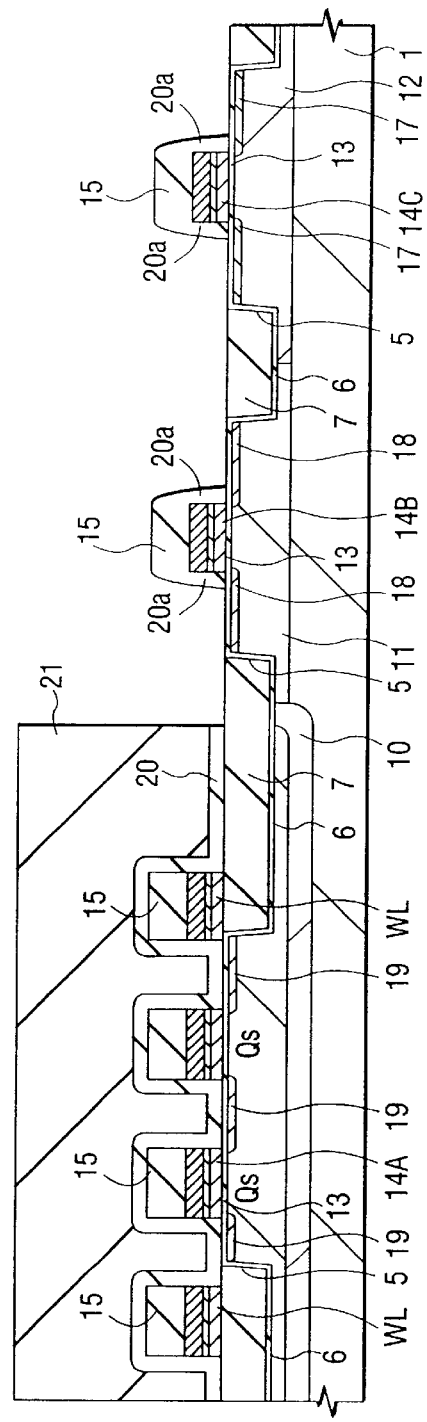

HSG SEMICONDUCTOR CAPACITOR WITH MIGRATION INHIBITION LAYER

This application is a Divisional application of prior Application Ser. No. 09/390,683, filed Sep. 7, 1999 now U.S. Pat. No. 6,524,927, the contents of which are incorporated herein by reference in their entirety.

BACKGROUND OF THE INVENTION

This invention relates to a semiconductor device and a fabrication technology thereof. More particularly, this invention relates to a technology that will be effective when applied to semiconductor memory devices having a DRAM (Dynamic Random Access Memory).

Memory cells of the DRAM are arranged in matrix on a main plane of a semiconductor substrate and are positioned at points of intersections between a plurality of word lines and a plurality of bit lines. Each memory cell comprises one memory cell selecting MISFET (Metal Insulator Semiconductor Field Effect Transistor) and one information storing capacitance device (capacitor) connected in series with the MISFET. The memory cell selecting MISFET is formed in an active region encompassed by a device isolation region, and mainly comprises a gate oxide film, a gate electrode formed integrally with the word line and a pair of semiconductor regions that constitute the source and the drain. The bit line is disposed over the memory cell selecting MISFET and is electrically connected to one of the source and drain that are shared by two memory cell selecting MISFETs adjacent to each other in the extending direction of the bit line. The information storing capacitance device is likewise disposed over the memory cell selecting MISFET and is electrically connected to the other of the source and drain.

A DRAM having a COB (Capacitor-Over-Bitline) structure having an information storing capacitor disposed over a bit line increases its surface area by cylindrically processing the lower electrode (storing electrode) of the information storing capacitance device positioned over the bit line in order to make up for the loss of the quantity of the charge stored (Cs) resulting from scale-down of the memory cell, and forms a capacitance insulating film and an upper electrode (plate electrode) over the surface.

As the integration density of the devices increases and the cell area diminishes, cubic configuration of the capacitor is necessary to a certain extent in order to secure operation reliability of the capacitor formed in the memory cell array region as a semiconductor memory device in the memory cell having the COB structure. When the capacitor having such a cubic configuration is formed and then an inter-level insulating film is formed, a step or a difference of levels corresponding to the height of the capacitor develops between the memory cell region and the peripheral circuit region.

Such a step tends to become higher and higher as the integration density of DRAMs increases and predetermined capacitance must be secured. To improve the integration density of the DRAMs, the improvement in exposure accuracy of photolithography is required and the value of the focal length that is allowed for satisfying this requirement becomes severer and severer. The increase of the step and the drop of the margin of the exposure focus in photolithography incur the problem that the formation of wiring layers formed on the inter-level insulating film becomes difficult.

To cylindrically process the lower electrode as described above, the process steps gets much more complicated, and the structure which is simplified to maximum is required.

However, such a simplified structure of the lower electrode cannot increase the surface area, and ends up with the opposite result to the reduction of the step described above.

One of the methods of avoiding the problem of such a cubic structure capacitor is described in "Applied Physics", Vol. 65, No. 11, pp. 1106–1113, Nov. 10, 1996, published by the Society of Applied Physics. This paper proposes a technology of a so-called "HSG (Hemispherical Silicon Grain)" structure that coarsens the silicon surface of the lower electrode to form fine ruggedness and substantially increases the surface area without increasing the lower electrode size.

On the other hand, Japanese Patent Laid-Open No. 56155/1998 describes a technology for forming an amorphous silicon film before the formation of crystal nuclei in a method of forming the HSG structure, and Japanese Patent Laid-Open No. 298284/1997 or No. 204426/1994 describes a technology that forms a second amorphous silicon film not containing an impurity on a first amorphous silicon film containing an impurity, and forms the HSG structure in the second amorphous silicon film.

SUMMARY OF THE INVENTION

However, the technologies of the HSG structure described above are not free from the following problems. In other words, the occupying area of the lower electrode must be decreased with scale-down of the device size for satisfying the requirement for a higher integration density of DRAMs. In the case of the cylindrical lower electrode, in particular, it is necessary to reduce the inner diameter of the cylinder and to form with high accuracy granular silicon inside the very small cylinder. In other words, it becomes very difficult to control of the height (ruggedness) of granular silicon with the reduction of the thickness of the polycrystalline silicon thin film that constitutes the lower electrode.

As the thickness of the polycrystalline silicon thin film constituting the lower electrode is decreased, the resistance of the polycrystalline silicon film becomes higher, and it becomes more difficult to secure sufficient conductivity of the lower electrode. The problem of this high resistance becomes particularly remarkable because the thickness of the film portion after the growth of granular silicon becomes small.

The influences of the depletion layer of the capacitor electrode are another problem. If the impurity inside the lower electrode comprising the polycrystalline silicon film is not sufficiently activated, or if the amount of the impurity is not sufficient, the carrier concentration drops, and the depletion layer develops in the lower electrode on the interface with the capacitance insulating film depending on the potential relationship with the upper electrode. The depletion layer, if it develops, substantially increases the film thickness of the capacitance insulating film by the thickness corresponding to its effective film thickness, and eventually invites the drop of the capacitance value. In the case of the HSG structure, in particular, the high impurity concentration impedes the growth of granular silicon, and the impurity concentration is likely to be insufficient after the growth of granular silicon. In consequence, the problem of the depletion layer is more likely to get actualized.

It is therefore an object of the present invention to provide a technology capable of controlling the film thickness of a polycrystalline silicon film applied to a capacitor lower electrode, inclusive of the granular silicon portion (rugged portion).

It is another object of the present invention to provide a technology capable of controlling the height (ruggedness) of granular silicon on the surface of the polycrystalline silicon film.

It is another object of the present invention to provide a technology capable of preventing the increase of the resistance of the polycrystalline silicon film applied to the capacitor lower electrode and securing conductivity of the lower electrode.

It is still another object of the present invention to provide a technology capable of preventing the occurrence of a depletion layer (depletion) of the polycrystalline silicon film at the boundary between the polycrystalline silicon film constituting the capacitor lower electrode and the capacitance insulating film, and suppressing the drop of a stored capacitance due to depletion.

The above and other objects and novel features of the present invention will become more apparent from the following description of the specification and the accompanying drawings.

The following will illustrate typical examples of the inventions disclosed in this application.

According to one aspect of the present invention, the first electrode that constitutes a capacitance device comprises a silicon film having a substantially equal film thickness and a granular silicon crystal on the surface of the silicon film. Therefore, the resistance of the first electrode can be reduced.

According to another aspect of the present invention, a granular silicon crystal is formed by supplying silicon from an amorphous silicon film formed on the silicon film when a first electrode constituting a capacitance device is formed. In this instance, the supply of silicon is made only from amorphous silicon but not from the silicon film. Therefore, the height of the granular silicon crystal and its grain size can be easily controlled.

According to still another aspect of the present invention, the silicon film does not contribute to the formation of the granular silicon crystal. Therefore, a silicon film having a high impurity concentration can be employed, and the resistance of the first electrode can be lowered.

According to still another aspect of the present invention, a silicon film having a high impurity concentration can be employed, and depletion of the first electrode can be reduced. Therefore, the drop of the stored capacitance can be prevented.

According to still another aspect of the present invention, the formation condition of the crystal grains becomes easier by forming the granular silicon crystal by using amorphous silicon containing an impurity in a low concentration.

BRIEF DESCRIPTION OF THE DRAWINGS

FIGS. 3 to 26 and FIGS. 29 to 31 are sectional views each showing step-wise a fabrication step of the DRAM according to the embodiment 1;

DESCRIPTION OF THE PREFERRED EMBODIMENTS

Figure 1:
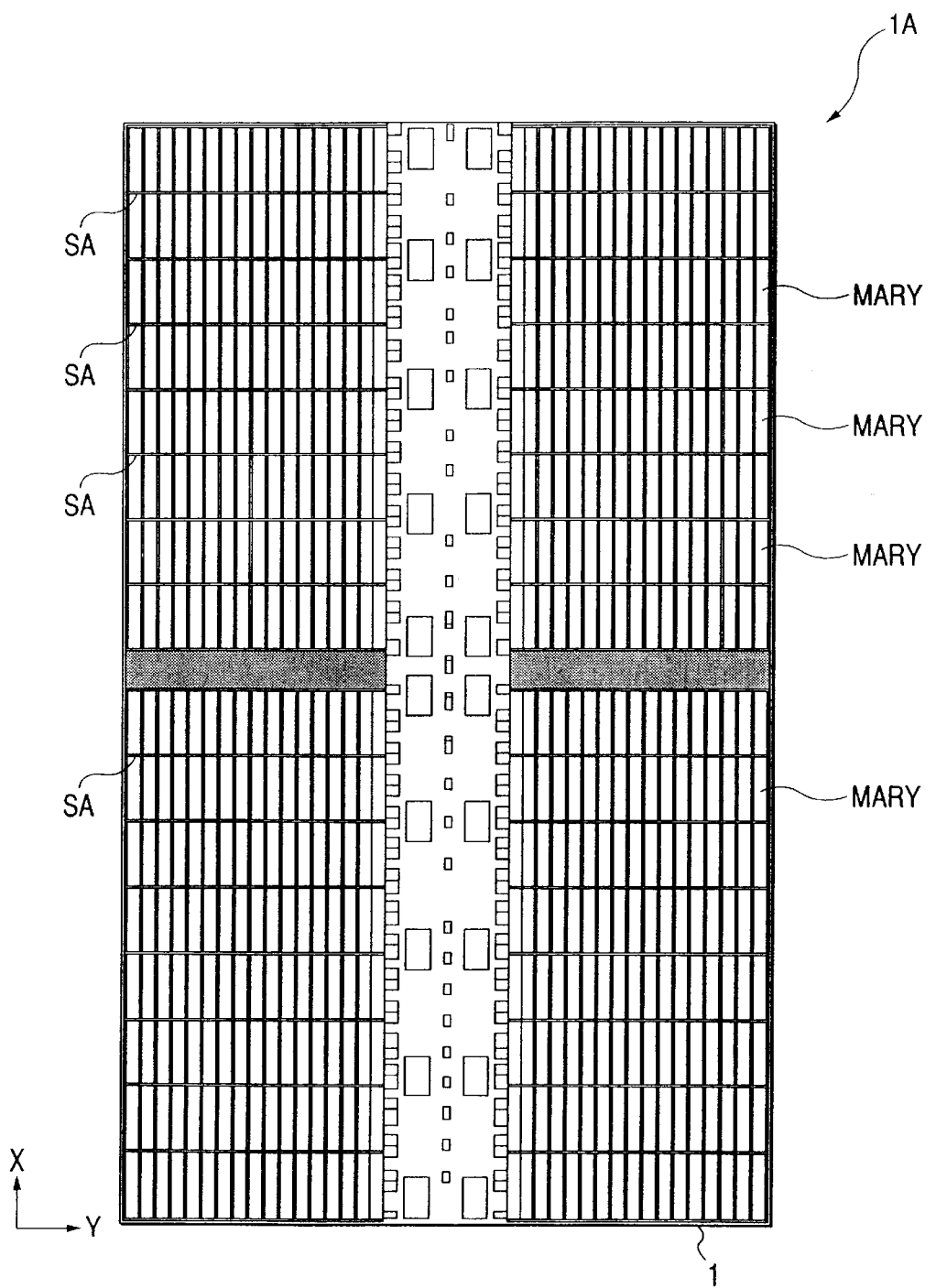
FIG. 1 is an overall plan view of a semiconductor chip having a DRAM according to en embodiment 1 of the present invention.

Some preferred embodiments of the present invention will be described hereinafter with reference to the accompanying drawings. Incidentally, like reference numerals will be used throughout the drawings for explaining the embodiments to identify members having like functions, and repetition of the explanation of such members will be omitted.

Embodiment 1

FIG. 1 is an overall plan view of a semiconductor chip having a DRAM formed thereon according to the embodiment 1. As shown in the drawing, a large number of memory arrays MARY are disposed in matrix on a main plane of a semiconductor chip 1A made of single crystal silicon in an X direction (the direction of the major side of the semiconductor chip 1A) and in a Y direction (the direction of the minor side of the semiconductor chip 1A). Sense amplifiers SA are interposed between the memory arrays MARY adjacent to one another in the X direction. Control circuits such as word drivers WD, data line selecting circuits, etc., input/output circuits, bonding pads, and so forth, are disposed at the central portion of the main plane of the semiconductor chip 1A.

Figure 2:
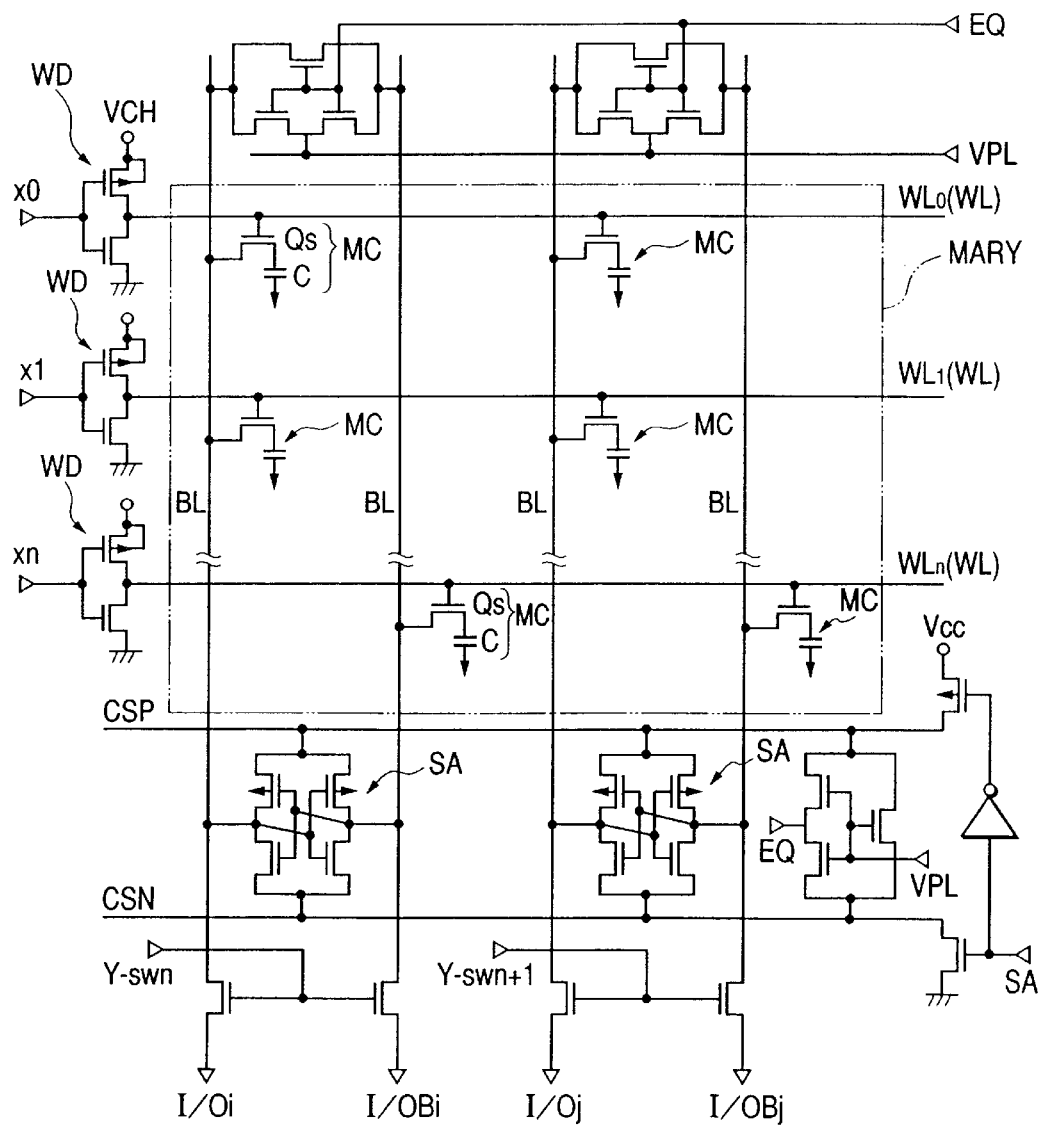
FIG. 2 is an equivalent circuit diagram of the DRAM in the embodiment 1.

FIG. 2 is an equivalent circuit diagram of the DRAM according to the embodiment 1. As shown in the drawing, each memory array (MARY) of this DRAM comprises a plurality of word lines WL ($WL_0$, $WL_1$, . . . , $WL_n$) and a plurality of bit lines BL that are arranged in matrix, and a plurality of memory cells (MC) positioned at the points of intersection of the word lines and the bit lines. One memory cell for storing one-bit information comprises one information storing capacitance device C and one memory cell selecting MISFET Qs connected in series with the capacitance device C. One of the source and drain of the memory cell selecting MISFET Qs is electrically connected to the information storing capacitance device C and the other is electrically connected to the bit line BL. One of the ends of the word line WL is connected to a word driver WD and one of the ends of the bit line is connected to the sense amplifier SA.

Next, a method of fabricating the DRAM according to this embodiment will be explained step-wise with reference to the drawings.

FIGS. 3 to 31 are sectional views showing step-wise an example of a fabrication process of the DRAM according to the embodiment 1.

Figure 3:
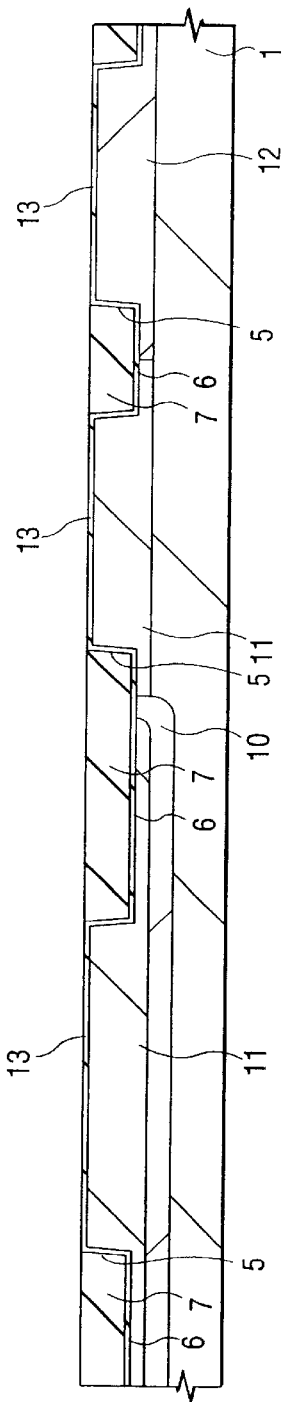

Initially, device isolation regions and well regions into which an impurity is doped are formed as shown in FIG. 3. A semiconductor substrate 1 of p-type single crystal silicon having resistivity of about 10 Ωcm is prepared, and a thin silicon oxide film (not shown) having a film thickness of about 10 nm and formed by wet oxidation at about 850° C., for example, and a silicon nitride film (not shown) having a film thickness of about 140 nm and formed by CVD (Chemical Vapor Deposition), for example, are deposited on the semiconductor substrate 1. Though this embodiment typically illustrates the single crystal silicon semiconductor substrate 1, a SOI (Silicon-On-Insulator) substrate having a single crystal silicon layer on the surface thereof, or a dielectric substrate, such as of glass or ceramics having a polycrystalline silicon film on the surface thereof, may be used, as well.

Next, the silicon nitride film and the silicon oxide film in the region, in which trenches 5 are to be formed, are patterned by using a photoresist film (not shown) as a mask, and the semiconductor substrate 1 is dry etched using this silicon nitride film as the mask to thereby form the trenches 5 having a depth of about 300 to 400 nm in the semiconductor substrate 1 of the device isolation region.

After the photoresist film is removed, a silicon oxide film 6 (about 10 nm-thick) is formed on the inner wall of the trench 5 by wet etching at 850 to 900° C., for example, in order to eliminate the damage layer created on the inner wall of the trench 5 by etching described above. A silicon oxide film (not shown) is deposited to a film thickness of about 300 to 400 nm by plasma CVD using ozone ($O_3$) and tetraethoxysilane (TEOS) as a source gas, for example. This silicon oxide film may be sintered by dry oxidation at about 1,000° C.

Next, the silicon oxide film in the region other than inside the trenches 5 is polished and removed by CMP and a device isolation region is defined inside the trenches 5 in such a manner as to leave the silicon oxide film 7 inside the trenches 5. Incidentally, dishing, that polishes the silicon oxide film in the trench region 5 excessively deeply, can be prevented by forming a silicon nitride film in the region of the trenches 5 prior to polishing by CMP.

Next, the silicon oxide film and the silicon nitride film that remain on the surface of the semiconductor substrate 1 are removed by wet etching using hot phosphoric acid, for example, and then an n-type impurity such as P (phosphorus) is ion-implanted into the semiconductor substrate 1 of the region (memory array), in which memory cells are to be formed, so as to form an n-type semiconductor region 10. A p-type impurity such as B (boron) is ion-implanted into the memory array and into a part of the peripheral circuit (the region in which n-channel MISFET is to be formed) so as to form p-type wells 11. Further, an n-type impurity such as P (phosphorus) is ion-implanted into other part of the peripheral circuit (the region in which a p-channel MISFET is to be formed) to form n-type wells 12. Subsequently, an impurity for regulating a threshold voltage of the MISFET such as $BF_2$ (boron fluoride) is ion-implanted into the p-type wells 11 and the n-type wells 12. The n-type semiconductor region 10 is formed in order to prevent noise from entering the p-type wells 11 of the memory array from the input/output circuit, etc., through the semiconductor substrate 1.

Next, the surface of the semiconductor substrate 1 is washed by a washing solution of an HF (hydrofluoric acid) type, and the semiconductor substrate 1 is wet oxidized at about 850° C. in such a manner as to form a clean gate oxide film 13 having a film thickness of about 7 nm on the surface of each of the p-type well 11 and the n-type well 12.

Incidentally, nitrogen may be segregated in the boundary between the gate oxide film 13 and the semiconductor substrate 1 by heat-treating the semiconductor substrate 1 in the atmosphere of NO (nitrogen monoxide) or $N_2O$ (nitrogen suboxide) (oxidation/nitriding treatment) after the gate oxide film 13 described above is formed, though this process step is not particularly restrictive. When the gate oxide film 13 becomes as thin as about 7 nm, the strain developing in the boundary between the gate oxide film 13 and the semiconductor substrate 1 becomes remarkable due to the difference of their thermal expansion coefficients, thereby inviting the occurrence of hot carriers. Nitrogen that is segregated in the boundary with the semiconductor substrate 1 mitigates this strain and for this reason, the oxidation/nitriding treatment described above can improve reliability of the extremely thin gate oxide film 13.

Figure 4:
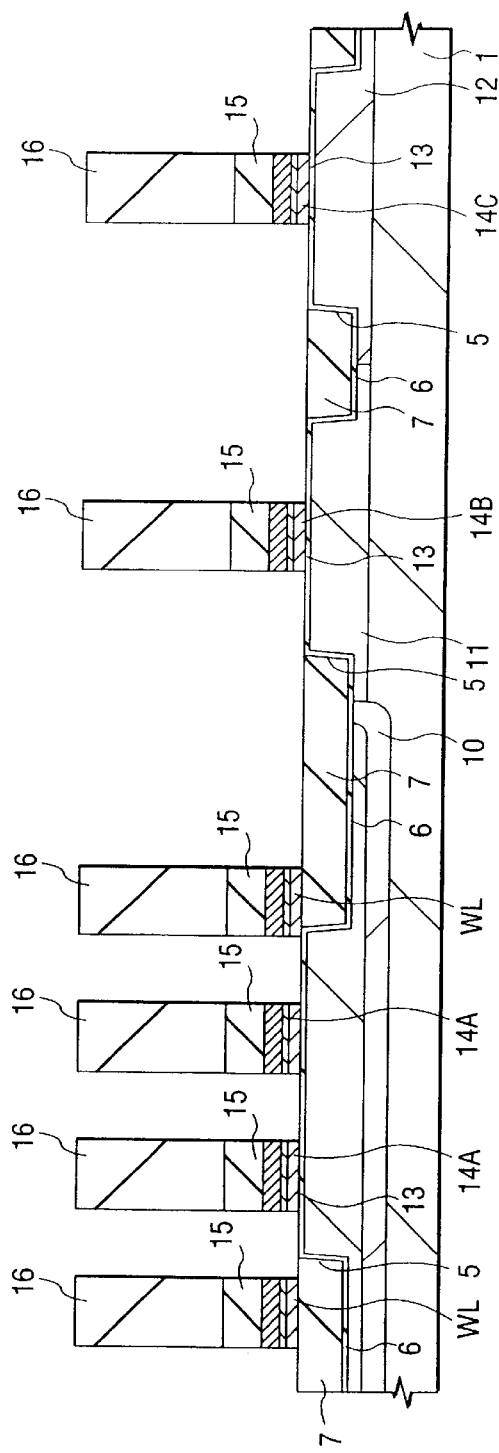

Next, gate electrodes 14A, 14B and 14C are formed on the gate oxide film 13 as shown in FIG. 4. The gate electrode 14A constitutes a part of the memory cell selecting MISFET and is used as a word line WL in the regions other than the active region. The width of this gate electrode 14A (word line WL), that is, the gate length, is set to the minimum size (e.g. about 0.24 $\mu$m) within the allowable range that can suppress the short channel effect of the memory cell selecting MISFET and can secure a predetermined value of the threshold value. The gap between the adjacent gate electrodes 14A (word lines WL) is the minimum size (e.g. 0.22 $\mu$m) that is determined by the resolution limit of photolithography. The gate electrode 14B and the gate electrode 14C constitute a part of the n-channel MISFET and the p-channel MISFET of the peripheral circuit, respectively.

The gate electrode 14A (word line WL) and the gate electrodes 14B and 14C are formed by the steps of depositing an about 70 nm-thick polycrystalline silicon film, into which an n-type impurity such as P (phosphorus) is doped, by CVD on the semiconductor substrate 1, depositing by sputtering an about 50 nm-thick WN (tungsten nitride) film and an about 100 nm-thick W film on the polycrystalline silicon film, depositing further an about 150 nm-thick silicon nitride film 15 by CVD, and patterning these films using a photoresist film 16 as the mask. The WN film functions as a barrier layer that prevents the W film from reacting with the polycrystalline silicon film at the time of heat-treatment at a high temperature and from forming a silicide layer having a high resistance in their boundary. Beside this WN film, a TiN (titanium nitride) film, etc., can be used as the barrier layer.

When a part of the gate electrode 14A (word line WL) is constituted by a low resistance metal (W), the sheet resistance can be reduced to about 2 to about 2.5 $\Omega$/square and consequently, the word line delay can be reduced. Because the word line delay can be thus reduced without lining the gate electrode 14 (word line WL) by an Al wiring, the number of wiring layers formed over the memory cell can be reduced by one layer.

Next, after the photoresist film 16 is removed, the dry etching residue and the photoresist residue remaining over the surface of the semiconductor substrate 1 are cleaned using an etching solution of hydrofluoric acid, or the like. When this wet etching is carried out, the gate oxide film 13 of the regions other than below the gate electrode 14A (word line WL) and the gate electrodes 14B and 14C is cut off, and the gate oxide film 13 below the gate side wall is etched isotropically to generate an undercut. If this undercut is left as such, the withstand voltage of the gate oxide film 13 drops. Therefore, film quality of the gate oxide film 13 so cut is improved by wet oxidizing the semiconductor substrate 1 to about 900° C.

Next, as shown in FIG. 5, a p-type impurity such as B (boron) is ion-implanted into the n-type wells 12 to form p⁻-type semiconductor regions 17 in the n-type wells 12 on both sides of the gate electrode 14C. Similarly, an n-type impurity such as P (phosphorus) is ion-implanted into the p-type wells 11 to form n⁻-type semiconductor regions 18 in the p-type wells 11 on both sides of the gate electrode 14B, and to form n-type semiconductor regions 19 in the p-type wells 11 on both sides of the gate electrode 14A. The memory cell selecting MISFET Qs is formed in this way in the memory array.

After an about 50 to 100 nm-thick silicon nitride film 20 is deposited by CVD over the semiconductor substrate 1 as shown in FIG. 6, the silicon nitride film 20 of the memory array is covered with a photoresist film 21, and side wall spacers 20a are formed on the side walls of the gate electrodes 14B and 14C by etching anisotropically the silicon nitride film 20 of the peripheral circuit. This etching is carried out using an etching gas, which provides a large etching rate of the silicon nitride film 20 to the silicon oxide film so that the cut quantity of the silicon oxide film 7 buried into the gate oxide film 13 and into the device isolation region 5 becomes minimal. The over-etching quantity must be kept to a minimum necessary level so that the cut amount of the silicon nitride film 15 on the gate electrodes 14B and 14C becomes minimal.

Figure 7:
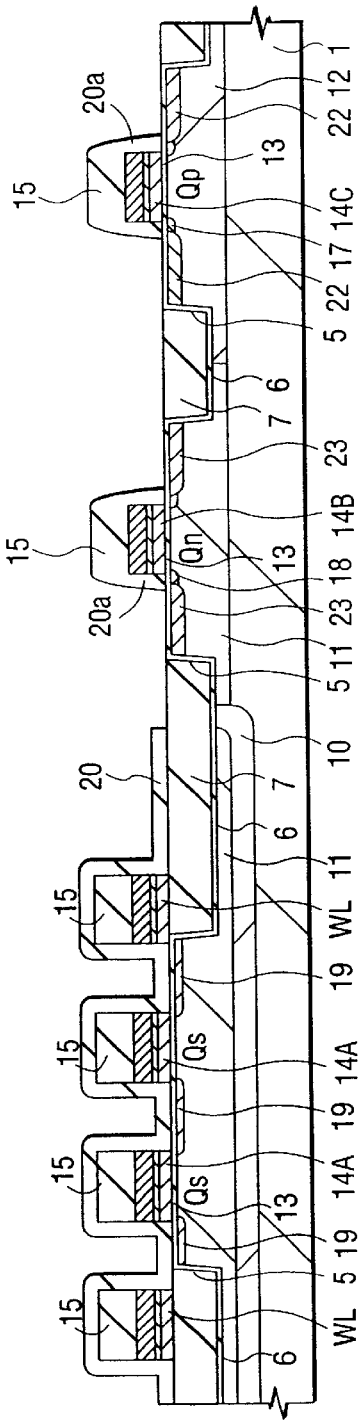

Next, after the photoresist film 21 is removed, a p-type impurity such as B (boron) is ion-implanted into the n-type wells 12 of the peripheral circuit region in such a manner as to form p$^+$-type semiconductor regions 22 (source, drain) of the p-channel MISFET as shown in FIG. 7. Similarly, an n-type impurity such as As (arsenic) is ion-implanted into the p-type wells 11 of the peripheral circuit region in such a manner as to form n$^+$-type semiconductor regions 23 (source, drain) of the n-channel MIFET. In this way, a p-channel MISFET Qp and an n-channel MISFET Qn each having an LDD (Lightly Doped Drain) structure are formed in the peripheral circuit region.

Figure 8:
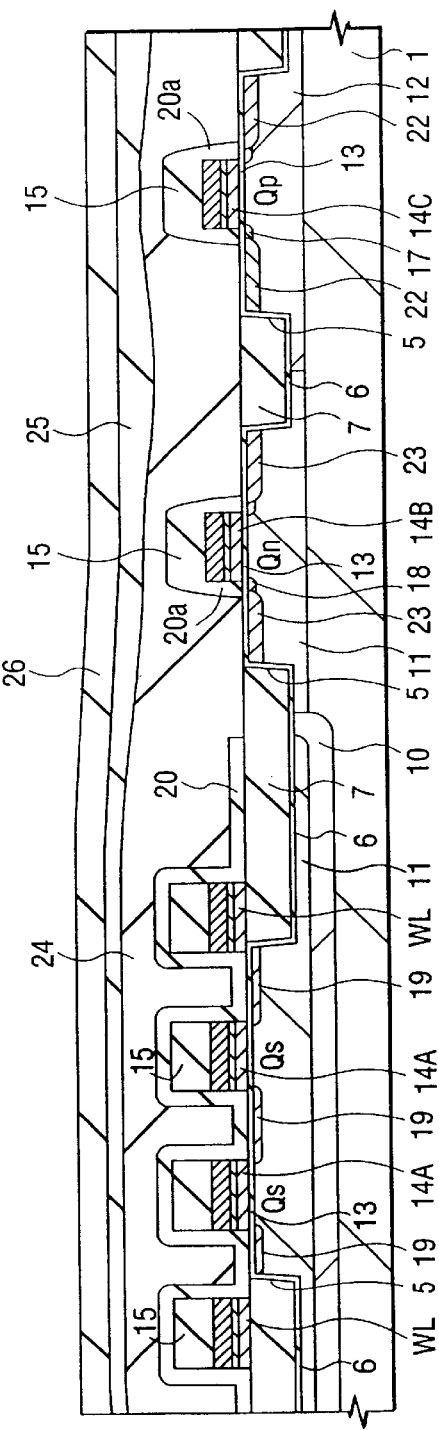

After an about 300 nm-thick SOG (Spin On Glass) film 24 is spin-coated over the semiconductor substrate 1 as shown in FIG. 8, the semiconductor substrate 1 is heat-treated at 800° C. for about one minute so as to sinter the SOG film 24. An about 600 nm-thick silicon oxide film 25 is deposited on the SOG film 24 and then the surface of this silicon oxide film 25 is polished to a flat surface by CMP. An about 100 nm-thick silicon oxide film 26 is deposited further on the silicon oxide film 25. This silicon oxide film 26 is deposited in order to repair very small scratches that develop on the surface of the silicon oxide film 25 during polishing by CMP. These silicon oxide films 25 and 26 are deposited by plasma CVD using zone ($O_3$) and tetraethoxysilane (TEOS) as the source gas, for example. A PSG (Phospho-Silicate-Glass) film, or the like, may be deposited in place of the silicon oxide film 26.

In this embodiment, the SOG film 24 having a high reflow property are applied over the gate electrode 14A (word line WL) and the gate electrodes 14B and 14C, and the silicon oxide film 25 deposited onto this SOG film 24 is rendered flat by CMP as described above. This arrangement can improve the gap-filling property of the fine gaps between the gate electrodes 14A (word lines WL), and can render flat the insulating film over the gate electrodes 14B and 14C.

Figure 9:
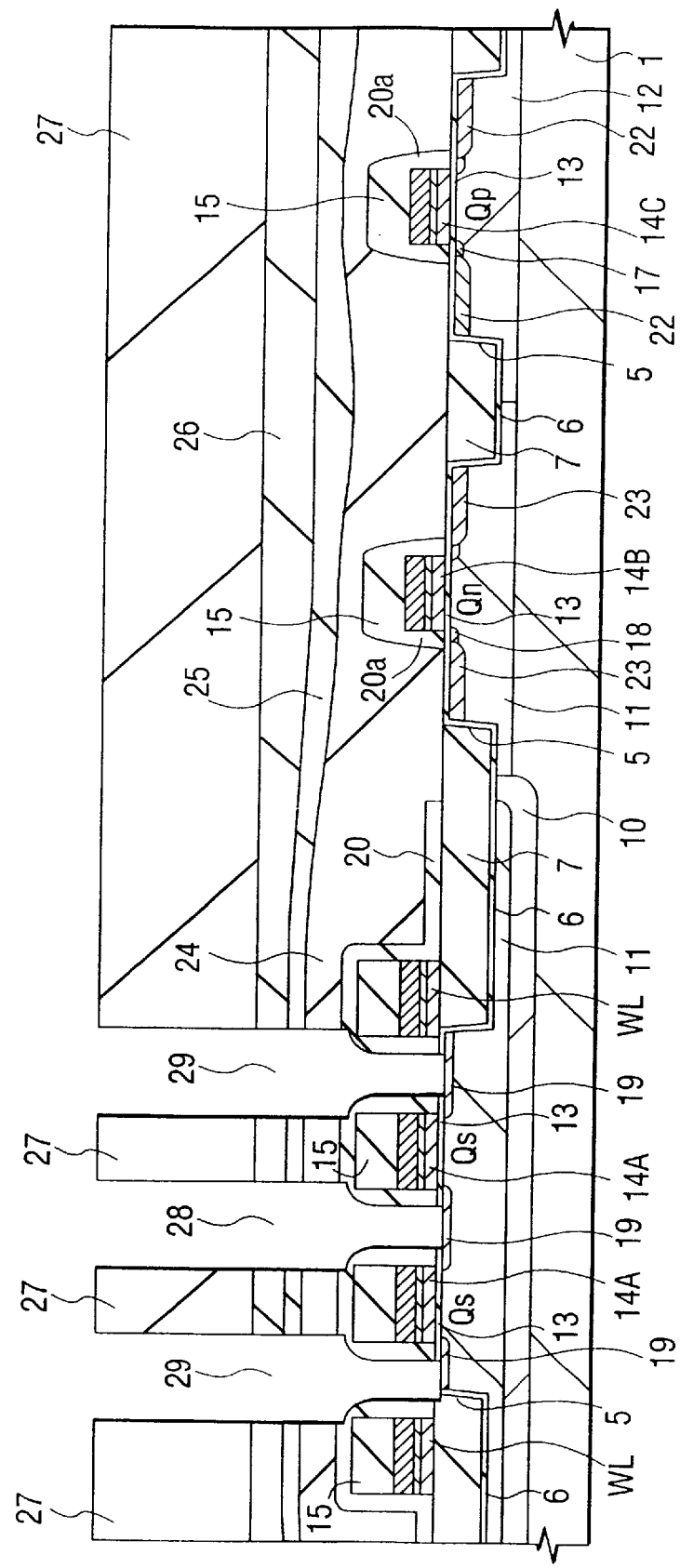

Next, the silicon oxide films 26 and 25 and the SOG film 24 over the n-type semiconductor region 19 (source, drain) of the memory cell selecting MISFET Qs are removed by dry etching using a photoresist film 27 as the mask as shown in FIG. 9. This etching is carried out under the condition such that the etching rate of the silicon oxide films 26 and 25 and the SOG film 24 becomes great with respect to the silicon nitride film 20 and that the silicon nitride film 20 covering the upper portion of the n-type semiconductor region 19 and the device isolation trench 5 is not completely removed. Subsequently, the silicon-nitride film 20 and the gate oxide film 13 over the n-type semiconductor region 19 (source, drain) of the memory cell selecting MISFET Qs are removed by dry etching using the photoresist film 27 as the mask, forming thereby contact holes 28 on one of the n-type semiconductor regions 19 (source, drain) and contact holes 29 on the other. This etching is carried out under the condition such that the etching rate of the silicon nitride film 15 becomes greater to the silicon oxide films (the gate oxide film 13 and the silicon oxide film 7 inside the device isolation trench 5) and the n-type semiconductor region 19 and the device isolation trench 5 are not cut excessively deeply. Furthermore, this etching is carried out under the condition such that the silicon nitride film 20 is etched anisotropically and the silicon nitride film 20 is left on the side walls of the gate electrode 14A (word line WL). In this way, the contact holes 28 and 29 having a very fine diameter below the resolution limit of photolithography can be formed in self-alignment with the gate electrodes 14A (word lines WL). To form the contact holes 28 and 29 in self-alignment with the gate electrodes 14A (word lines WL), it is possible to anisotropically etch in advance the silicon nitride film 20 and to form the side wall spacers on the side walls of the gate electrodes 14A (word lines WL).

Incidentally, the step surface is formed on the surfaces of the silicon oxide film 26 and the resist film 27 shown in FIG. 9 in such a manner as to extend along the surface of the silicon oxide film 25 in the peripheral circuit region shown in FIG. 8, and this step shape is omitted in FIG. 9.

Next, after the photoresist film 27 is removed, the dry etching residues and the photoresist residues on the substrate surface exposed at the bottom of the contact holes 28 and 29 are removed by an etching solution such as a mixed solution of hydrofluoric acid and ammonium fluoride. In this instance, the SOG film 24 exposed to the side walls of the contact holes 28 and 29 is exposed to the etching solution. However, because the etching rate of this SOG film 24 to the hydrofluoric acid type etching solution is lowered by the sintering operation at about 800° C. described above, the side walls of the contact holes 28 and 29 are not greatly undercut by this wet etching treatment. Consequently, short-circuit between the plugs, that are buried into the contact holes 28 and 29 in the next process step, can be prevented reliably.

Figure 10:
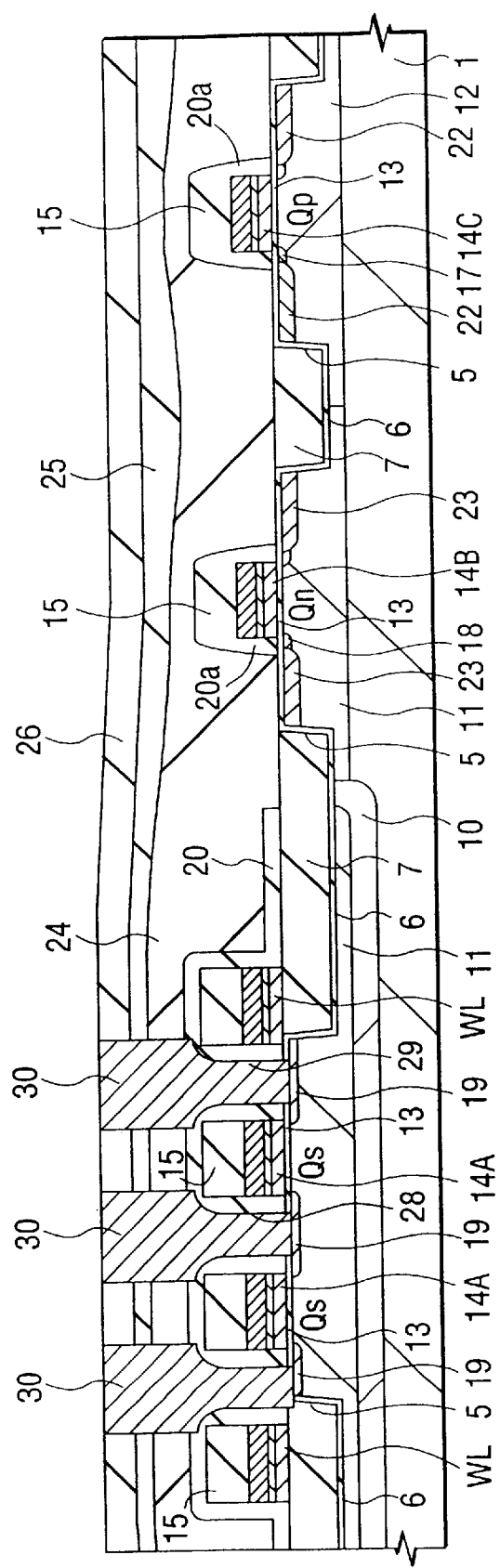

The plugs 30 are then formed inside the contact holes 28 and 29 as shown in FIG. 10. The plug 30 is formed by depositing by CVD a polycrystalline silicon film, into which an n-type impurity (such as P (phosphorus)) is doped, on the silicon oxide film 26 and polishing this polycrystalline silicon film by CMP in such a manner as to leave this film inside the contact holes 28 and 29.

Figure 11:
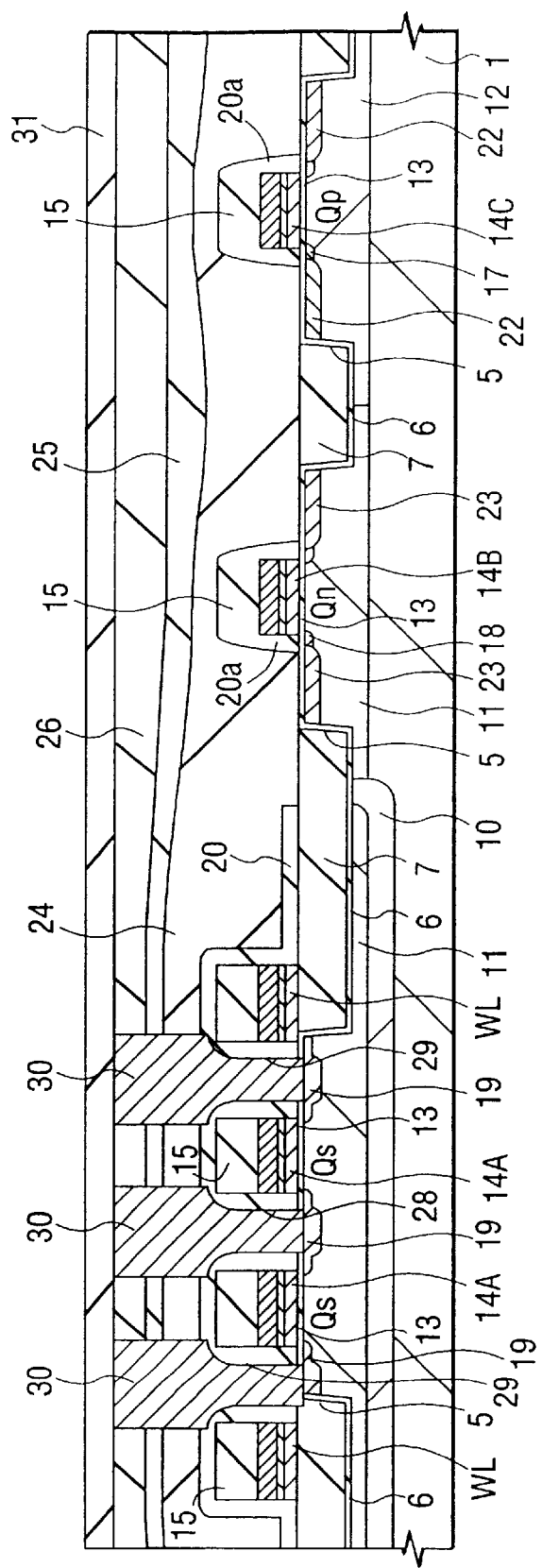

Next, an about 200 nm-thick silicon oxide film 31 is deposited onto the silicon oxide film 26 as shown in FIG. 11 and then the semiconductor substrate 1 is heated to about 800° C.

The silicon oxide film 31 is deposited by plasma CVD using ozone ($O_3$) and tetraethoxysilane (TEOS) as the source gas, for example. This heat-treatment causes the n-type impurity inside the polycrystalline silicon film constituting the plug 30 to diffuse into the n-type semiconductor region 19 (source, drain) of the memory cell selecting MISFET Qs from the bottom of the contact holes 28 and 29, lowering thereby the resistance of the n-type semiconductor region 19.

Figure 12:
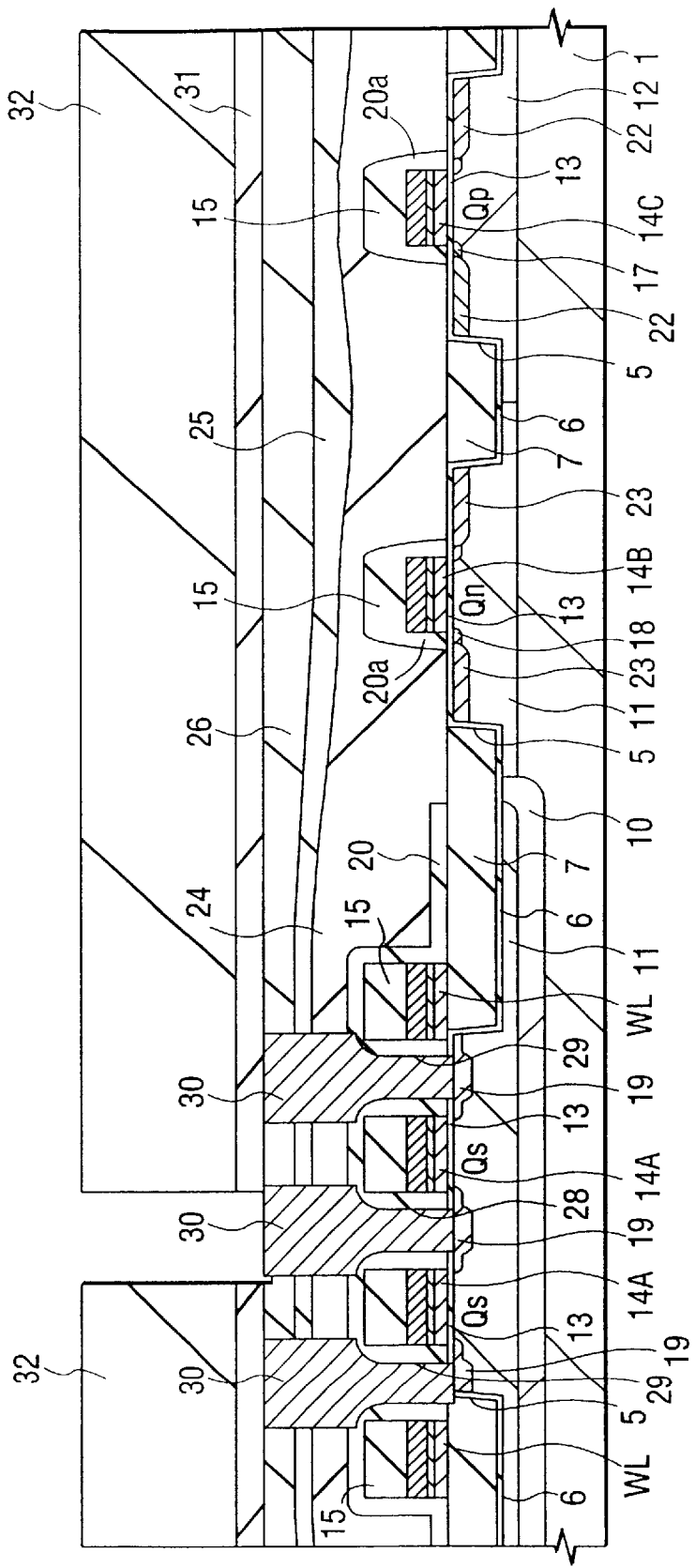
Figure 13:
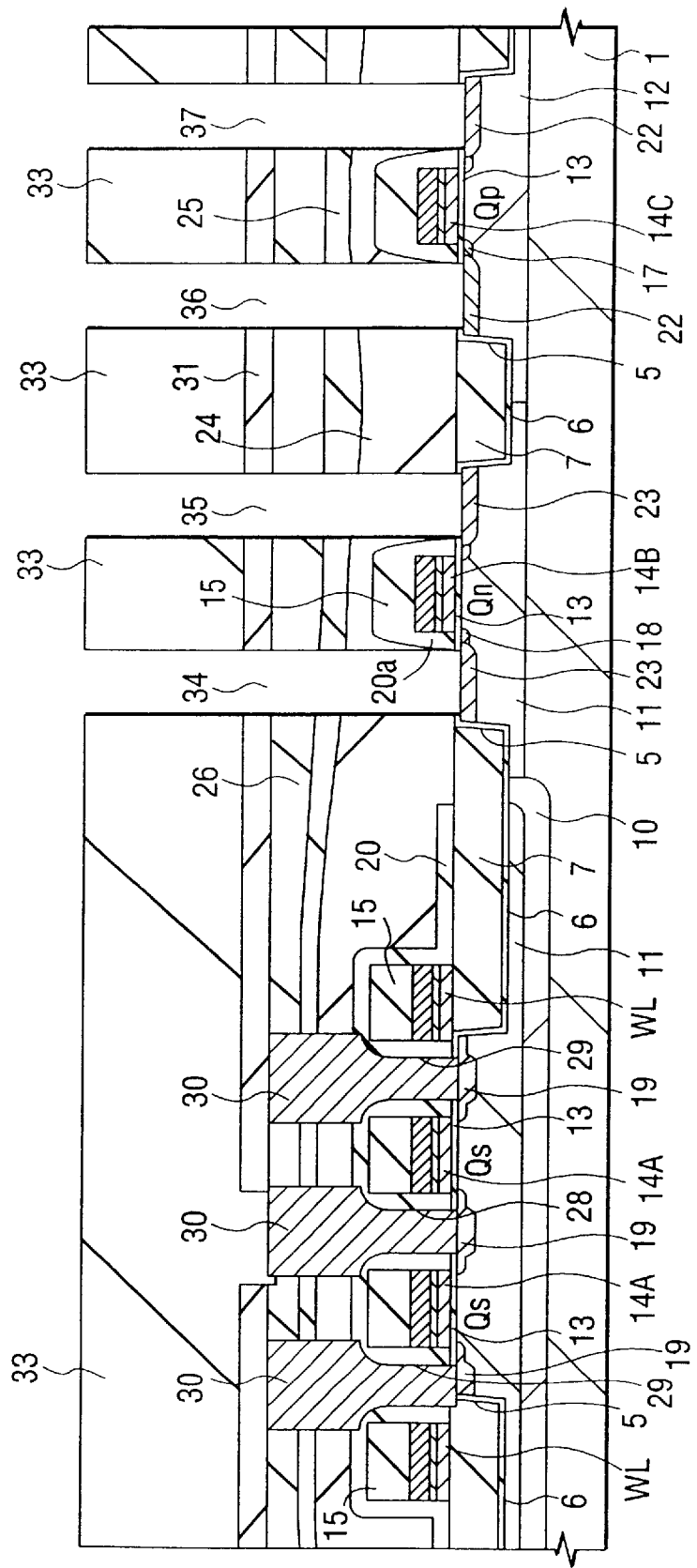

Next, as shown in FIG. 12, the silicon oxide film 31 on the contact hole 28 is removed by dry etching using a photoresist film 32 as the mask to expose the surface of the plug 30. As shown in FIG. 13, silicon oxide films 31, 26 and 25, the SOG film 24 and the gate oxide film 13 of the peripheral circuit region are removed by dry etching using a photoresist film 33 as the mask so as to form contact holes 34 and 35 on the n$^+$-type semiconductor region 23 (source, drain) of the n-channel MISFET Qn and to form contact holes 36 and 37 on the p+-type semiconductor region 22 (source, drain) of the p-channel MISFET Qp.

Figure 14:
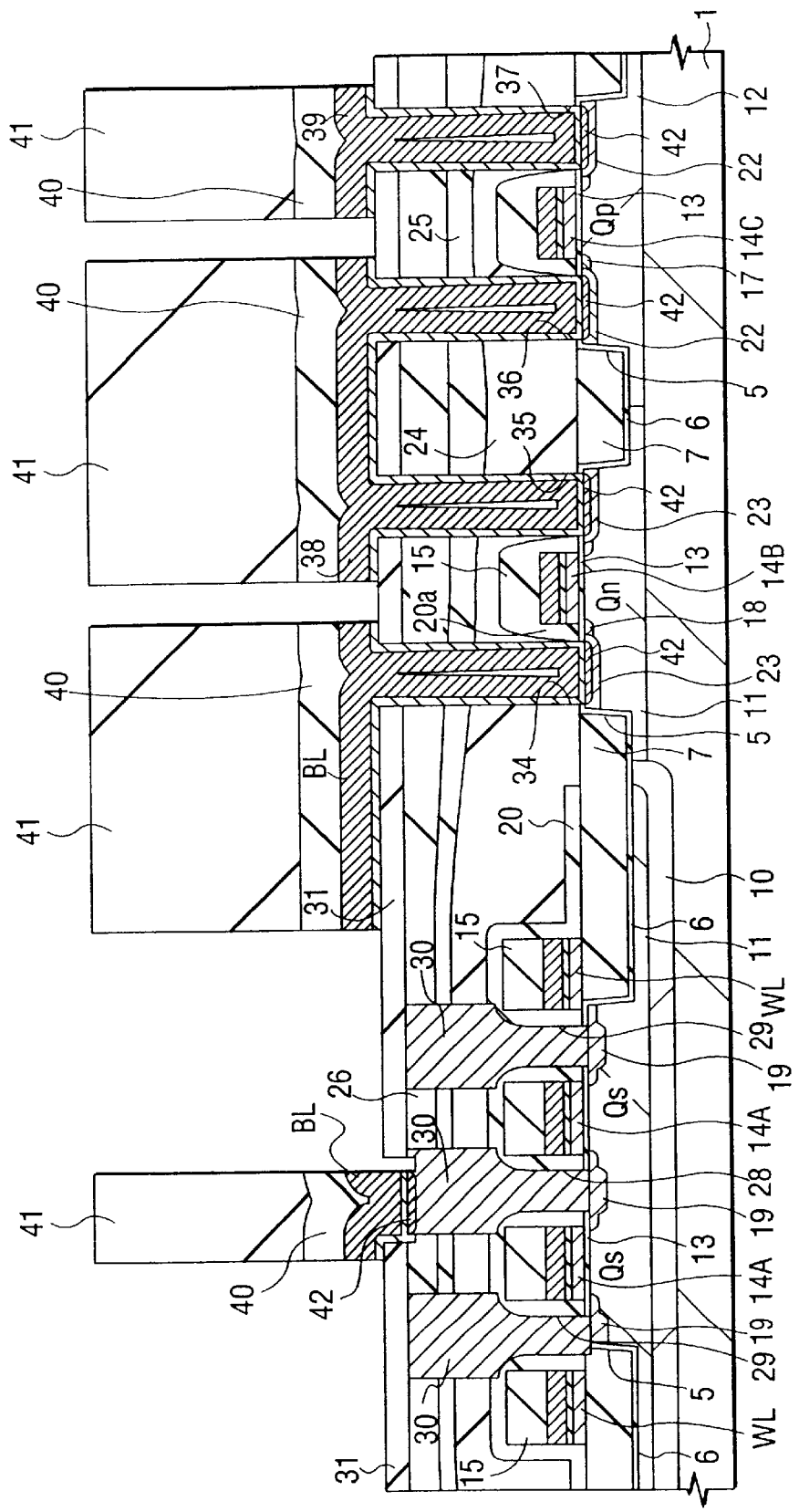
Figure 15:
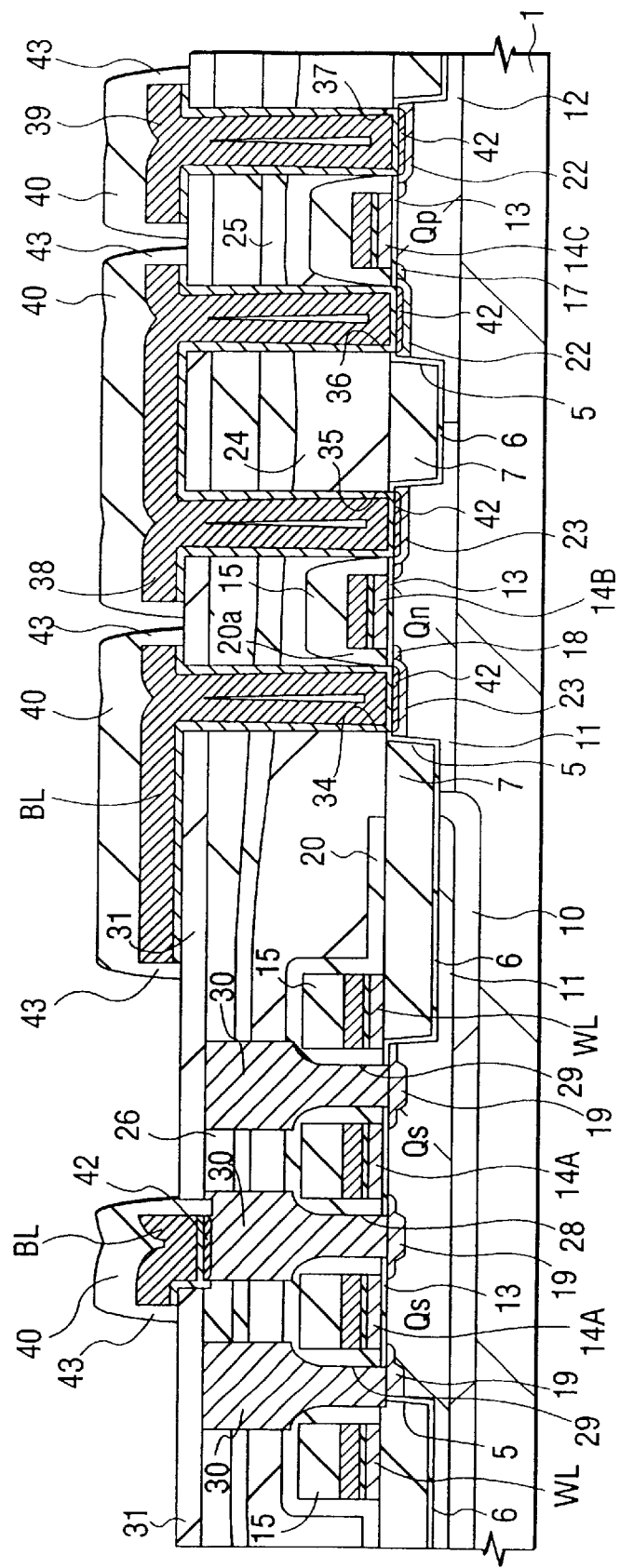

After the photoresist film 33 is removed, bit lines BL and first layer wirings 38 and 39 are formed on the silicon oxide film 31 as shown in FIG. 14. To form these bit lines BL and first layer wirings 38 and 39, an about 50 nm-thick Ti film is deposited on the silicon oxide film 31 by sputtering, and then the semiconductor substrate 1 is heat-treated at about 800° C. Next, an about 50 nm-thick TiN film is deposited on the Ti film by sputtering, and an about 150 nm-thick W film and an about 200 nm-thick silicon nitride film 40 are further deposited on the TiN film by CVD. These films are then patterned by using a photoresist film 41 as the mask.

After the Ti film is deposited on the silicon oxide film 31, the semiconductor substrate 1 is heat-treated at about 800° C. This heat-treatment causes the reaction between the Ti film and Si as the base, and a $TiSi_2$ (titanium silicide) film 42 having a low resistance is formed on the surface of the n+-type semiconductor region 23 (source, drain) of the n-channel type MISFET Qn, on the surface of the p+-type semiconductor region 22 (source, drain) of the p-channel MISFET Qp and on the surface of the plug 30.

In consequence, the contact resistance of the wirings (bit lines BL and first layer wirings 38 and 39) connected to the n+-type semiconductor region 23, the p+-type semiconductor region 22 and the plug 30 can be reduced. Because the bit line BL is constituted by the W film/TiN film/Ti film, the sheet resistance of the bit line can be lowered down to 2 Ω/square or below. Therefore, the information write or read rate can be improved and at the same time, because the bit line BL and the first layer wirings 38 and 39 of the peripheral circuit can be formed simultaneously by one step, the number of fabrication steps of the DRAM can be reduced. Furthermore, when the first layer wirings (38, 39) of the peripheral circuit are constituted by the same layer wiring of the bit lines BL, the aspect ratio of the contact holes (34 to 37) that connect the MISFETs (n-channel MISFET Qn and p-channel MISFET Qp) to the first layer wirings can be reduced with the result of further improvement in connection reliability of the first layer wirings.

In order to reduce as much as possible the parasitic capacitance formed between the adjacent bit lines BL and to improve the information read and write rates, the bit lines BL are formed so that their gap is greater than their width. The gap of the bit lines BL is about 0.24 μm, for example, and their width is about 0.22 μm, for example.

Incidentally, the $TiSi_2$ layer 42 involves the possibility of deterioration due to heat-treatment, and this heat-treatment is possibly the one that will be effected in the subsequent formation step of the capacitance insulating film for the information storing capacitance device that will be later described. As will also be explained later, however, the formation step of the capacitance insulating film in this embodiment is carried out at a low temperature. Therefore, the $TiSi_2$ layer 42 is free from deterioration due to the heat-treatment and the problem such as the rise of the connection resistance does not occur.

Next, after the photoresist film 41 is removed, side wall spacers 43 are formed on the side walls of the bit line BL and the side walls of the first layer wirings 38 and 39. The side wall spacers 43 are formed by depositing a silicon nitride film on the bit lines BL and the first layer wirings 38 and 39 by CVD, and then etching anisotropically this silicon nitride film.

Figure 16:
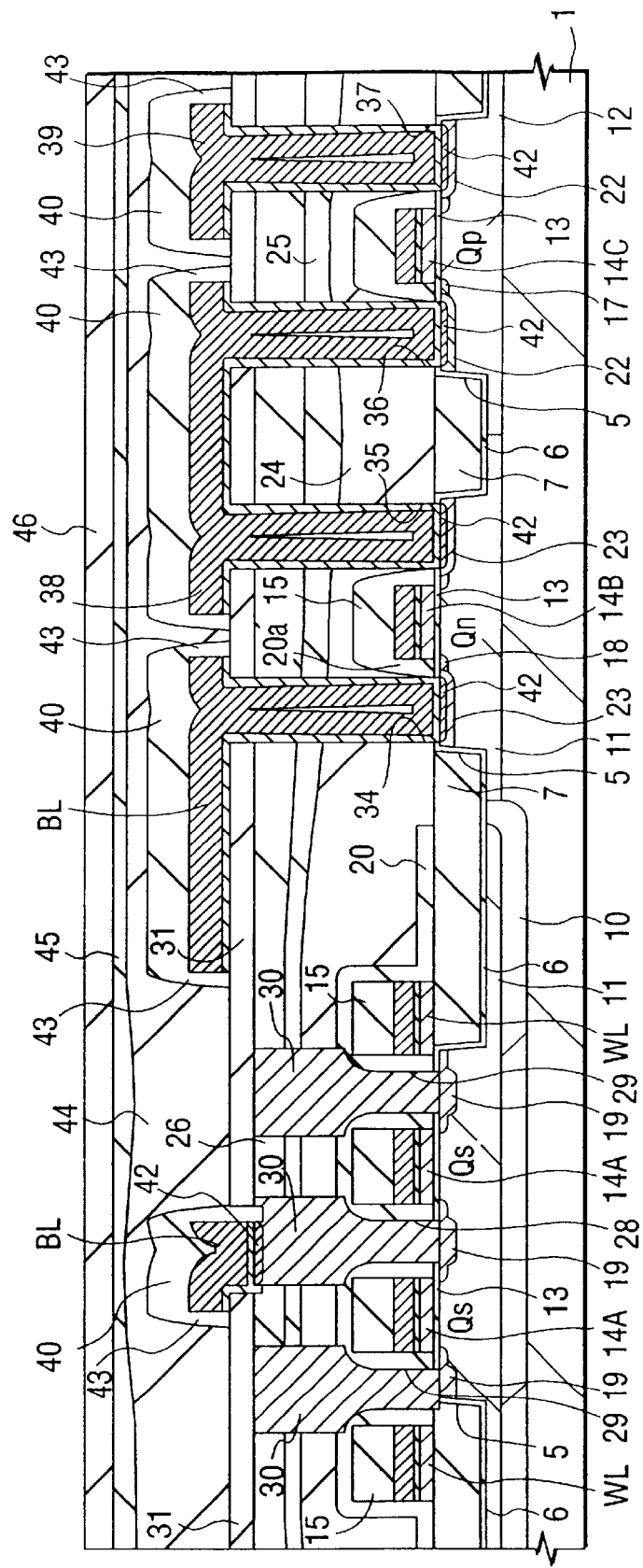

An about 300 nm-thick SOG film 44 is spin-coated on the bit lines BL and the first layer wirings 38 and 39 a shown in FIG. 16. This SOG film 44 is sintered by heat-treating the semiconductor substrate 1 at 800° C. for about one minute.

The SOG film 44 has a higher reflow property than the BPSG film and higher capability of filling the gap between the very fine wirings. Therefore, the SOG film 44 can satisfactorily fill the gap between the bit lines BL that are scaled down to approximately the resolution limit of photolithography. Because the SOG film 44 provides the high reflow property even if heat-treatment is not carried out at a high temperature and for a long time as has been required in the case of the BPSG film, it can restrict thermal diffusion of impurities contained in the source and drain of the memory cell selecting MISFETs Qs formed below the bit lines BL and in the source and drain of the MISFETs (n-channel MISFET Qn and p-channel MISFETs Qp) of the peripheral circuit, and can achieve a shallow junction. Furthermore, since deterioration of the metal (W film) constituting the gate electrodes 14A (word lines WL) and the gate electrodes 14B and 14C can be restricted, high performance can be accomplished for the MISFETs that constitute the memory cells of the DRAM and the peripheral circuit. Also, the wiring resistance can be reduced by suppressing deterioration of the Ti film, the TiN film and the W film that constitute the bit lines BL and the first layer wirings 38 and 39.

Next, an about 600 nm-thick silicon oxide film 45 is deposited on the SOG film 44 and is then polished by CMP to render it surface flat and smooth. The silicon oxide film 45 is deposited by plasma CVD using ozone ($O_3$) and tetraethoxysilane (TEOS) as the source gas, for example.

As described above, the SOG film 44 having high flatness is applied onto the bit lines BL and the first layer wirings 38 and 39 even immediately after their film formation, and the silicon oxide film 45 deposited further on the SOG film 44 is rendered flat and smooth by CMP in this embodiment. Therefore, the gap filling property of the very small gaps between the bit lines BL can be improved, and the insulating film on the bit lines BL and on the first layer wirings 38 and 39 can be rendered flat and smooth. Since the heat-treatment at a high temperature for a long time is not carried out, deterioration of performance of the MISFETs constituting the memory cell and the peripheral circuit can be prevented and high device performance can be accomplished. At the same time, the resistances of the bit lines BL and the first layer wirings 38 and 39 can be lowered.

Next, an about 100nm-thick silicon oxide film 46 is deposited on the silicon oxide film 45. This silicon oxide film 46 is deposited so as to repair very fine surface scratches of the silicon oxide film 45 generated during polishing by CMP. The silicon oxide film 46 is deposited by plasma CVD using ozone ($O_3$) and tetraethoxysilane (TEOS) as the source gas, for example.

Figure 17:
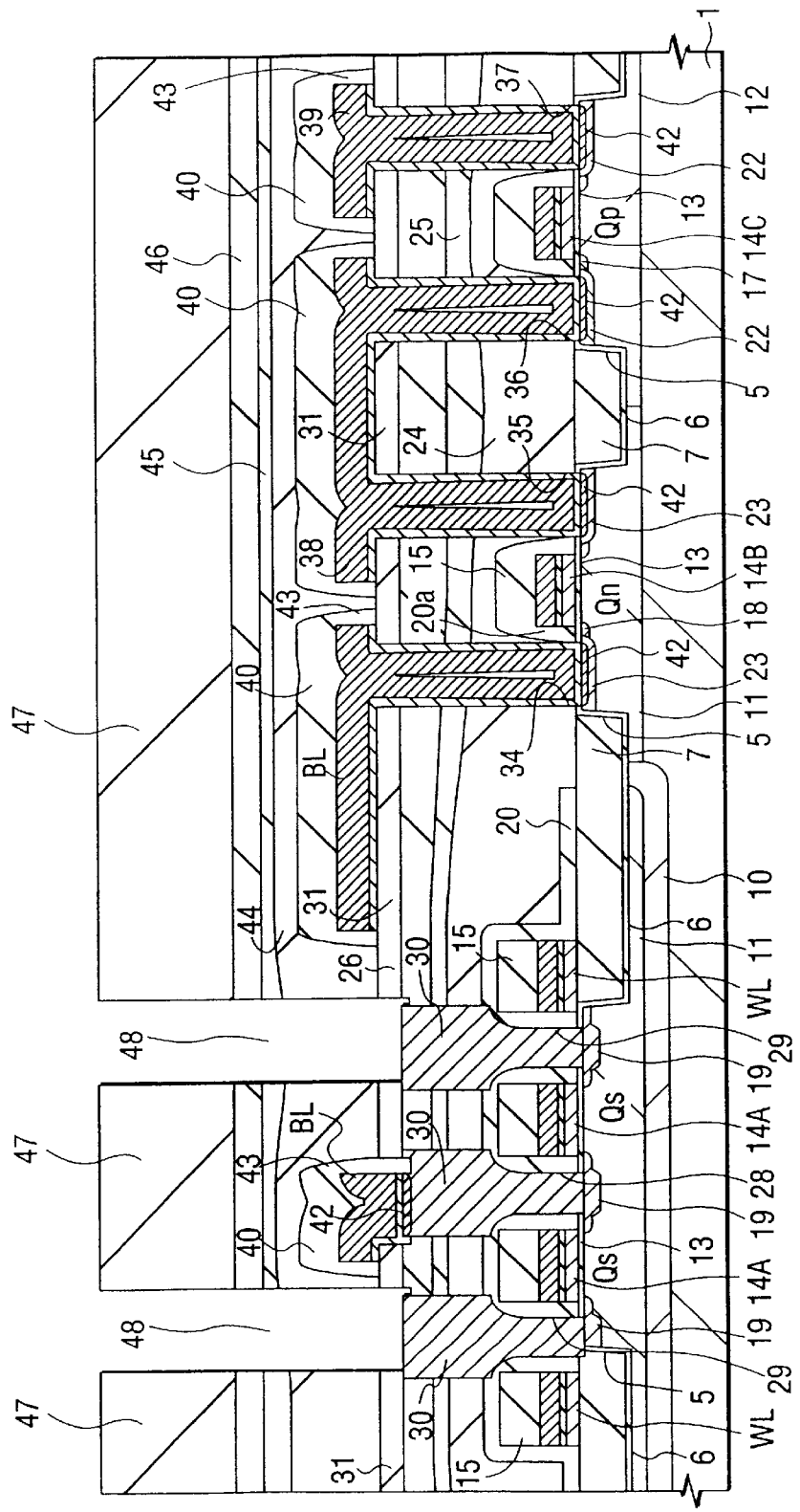

As shown in FIG. 17, the silicon oxide films 46 and 45, the SOG film 44 and the silicon oxide film 31 on the contact holes 29 are removed by dry etching using the photoresist film 47 as the mask and through-holes 48 reaching the surface of the plugs 30 are formed. This etching is carried out under the condition such that the etching rate of the silicon nitride film with respect to the silicon oxide films 46, 45 and 31 and to the SOG film 44 becomes small, and even when any error occurs between the through-hole 48 and the bit line BL, the silicon nitride film 40 and the side wall spacer 43 on the bit line BL are not cut off deeply. In this way, the through-holes 48 are formed in self-alignment with the bit lines BL.

After the photoresist film 47 is removed, the dry etching residues and the photoresist residues of the surface of the plugs 30 exposed to the bottom of the through-holes 48 are removed by using an etching solution such as a mixed etching solution of hydrofluoric acid and ammonium fluoride. In this instance, the SOG film 44 exposed on the side walls of the through-holes 48 are exposed to the etching solution, too, but they are not undercut greatly by this wet etching treatment because the etching rate of the SOG film 44 to the etching solution of the hydrofluoric acid type is reduced by the sintering treatment at about 800° C. as already described.

In consequence, it is possible to reliably prevent short circuit between the plugs, which are to be buried into the through-holes in the next process step, and the bit lines BL. Since the plugs and the bit lines BL can be sufficiently spaced apart from one another, the increase of the parasitic capacitance can be suppressed, too.

Figure 18:
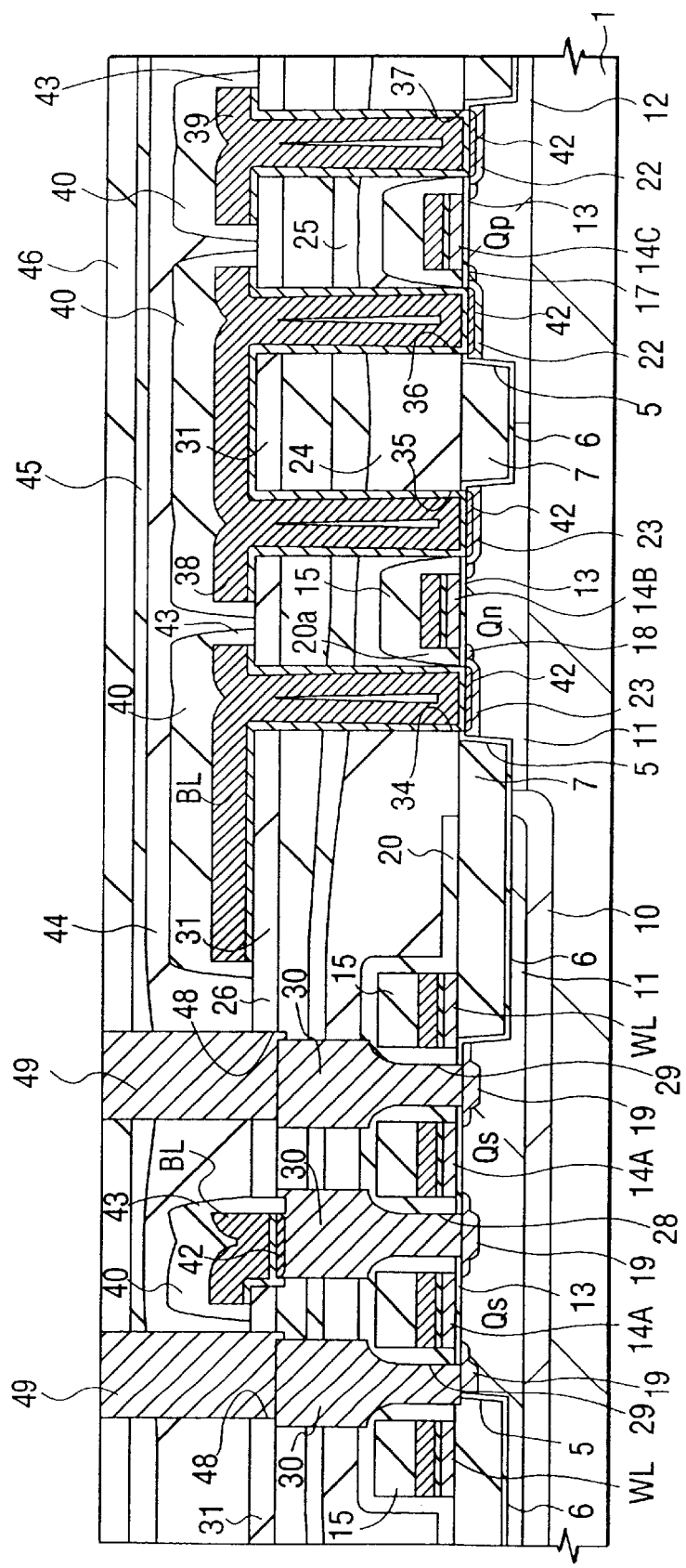

Next, the plug 49 is formed inside each through-hole 48 as shown in FIG. 18. The plug 49 comprises a polycrystalline silicon film and is formed in the same way as the plug 30. The plug 49 may also comprise a metal film such as tungsten (W) so long as it is a conductive layer.

Figure 19:
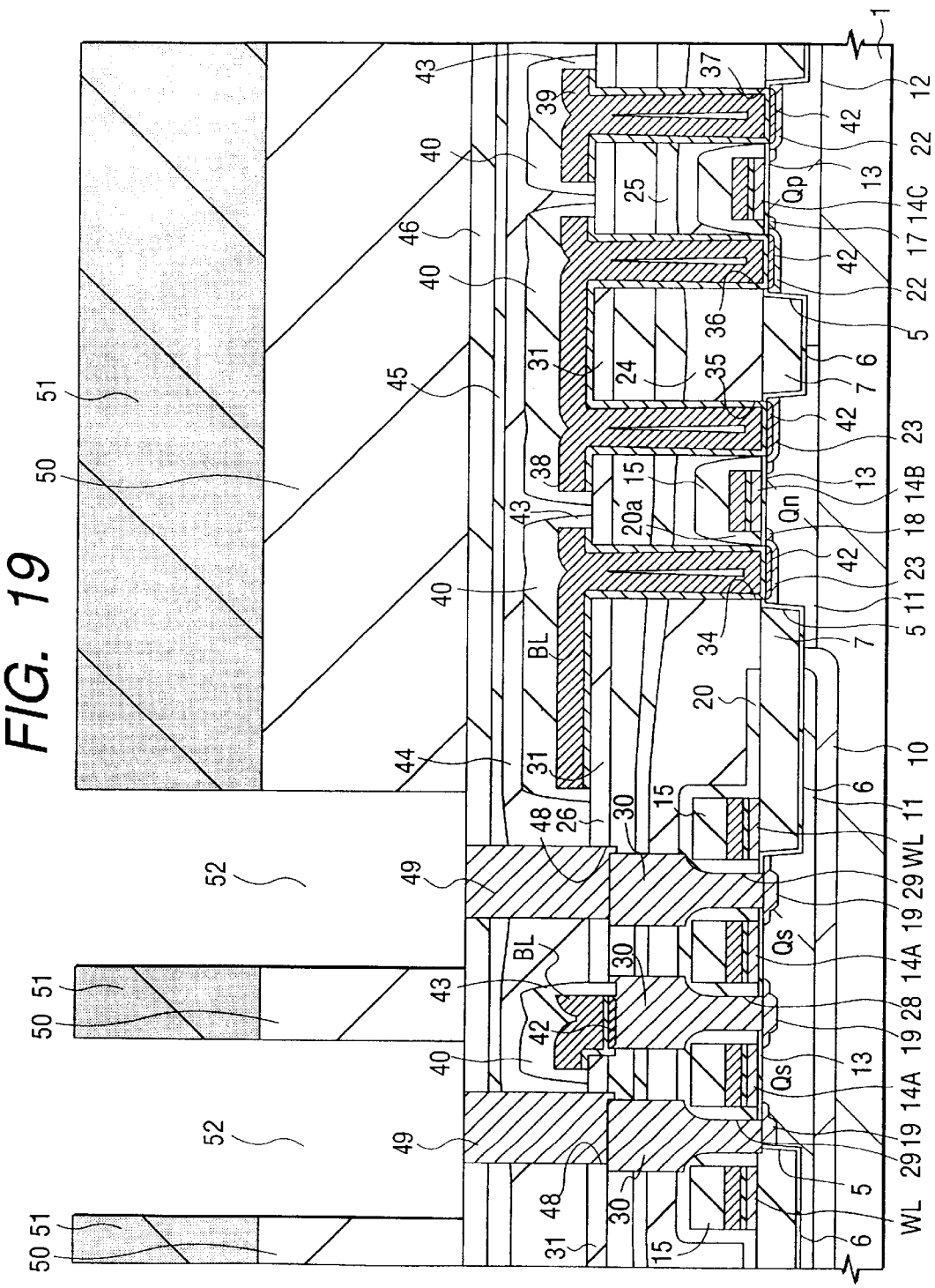

An about 1.3 μm-thick insulating film such as a silicon oxide film 50 is disposed on the silicon oxide film 46 as shown in FIG. 19, and is then dry etched using a photoresist film 51 as the mask to form a trench or opening 52. The silicon oxide film 50 is deposited by plasma CVD using ozone ($O_3$) and tetraethoxysilane (TEOS) as the source gas, for example. The trench 52 is formed in such a manner as to open above the plug 49 until the upper surface of the plug 49 is exposed. The lower electrode of a capacitor, which will be explained later, is formed on the inner wall of the trench 52.

Figure 20:
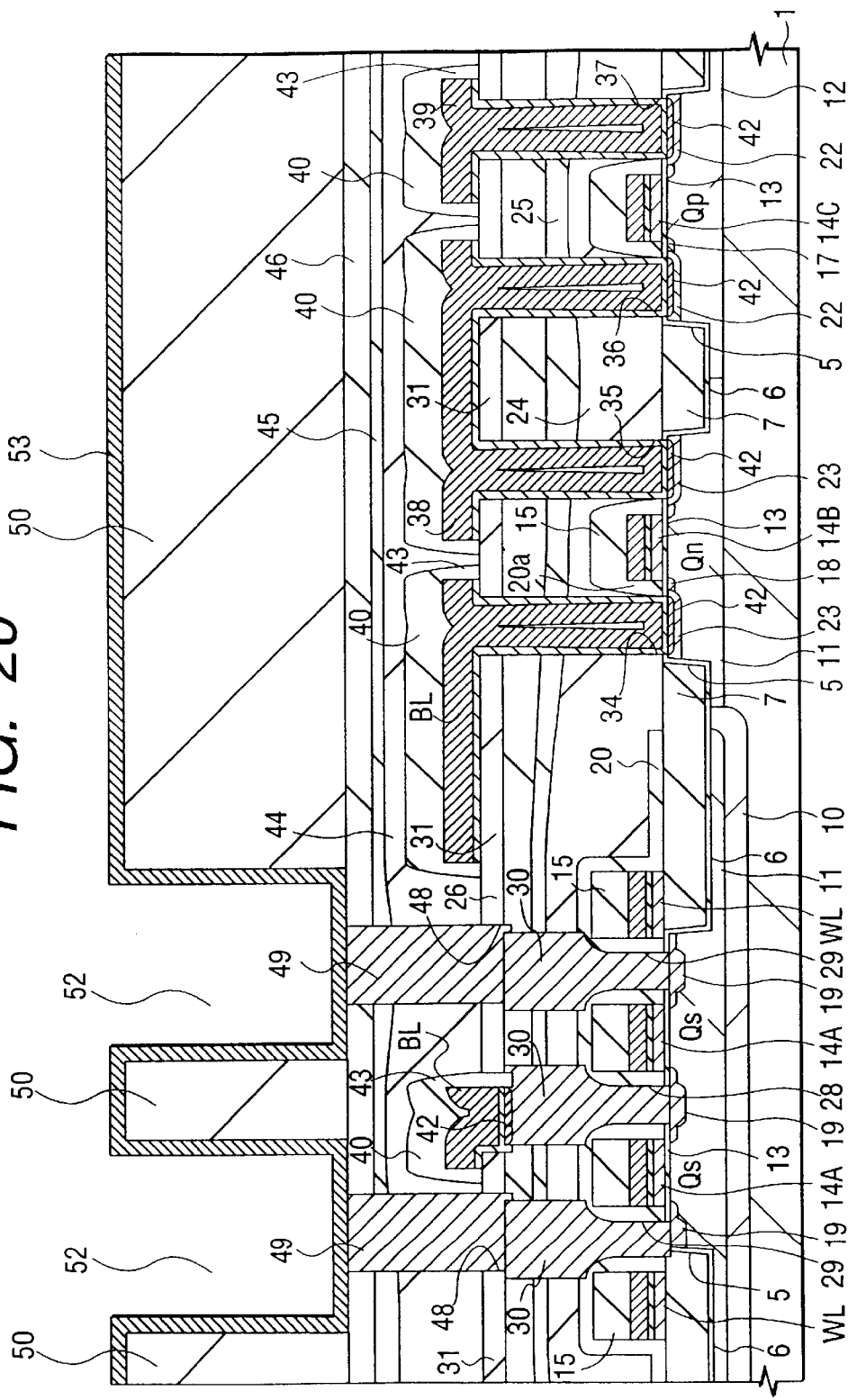

Next, after the photoresist film 51 is removed, a first layer amorphous silicon film 53 is deposited as shown in FIG. 20. The amorphous silicon film 53 is deposited by CVD to a film thickness of 30 nm. Phosphorus (P) is doped in the dose of about $4.0 \times 10^{20}$ atoms/cm$^3$ into the amorphous silicon film 53. Phosphorus can be doped by mixing phosphine ($PH_3$) as an impurity gas into the raw material gas when the amorphous silicon film 53 is deposited by CVD, but may also be introduced by ion-implantation, or the like. The first layer amorphous silicon film 53 is to be crystallized to a polycrystalline silicon film and to serve as a part of the lower electrode as will be explained later, but is crystallized in the film form without contributing to the growth of the granular silicon crystal. Therefore, conductivity of the lower electrode can be secured. Since the impurity having a relatively high concentration of about $4.0 \times 10^{20}$ atoms/cm$^3$ is introduced, conductivity of the lower electrode can be secured from this standpoint, too.

Figure 21:
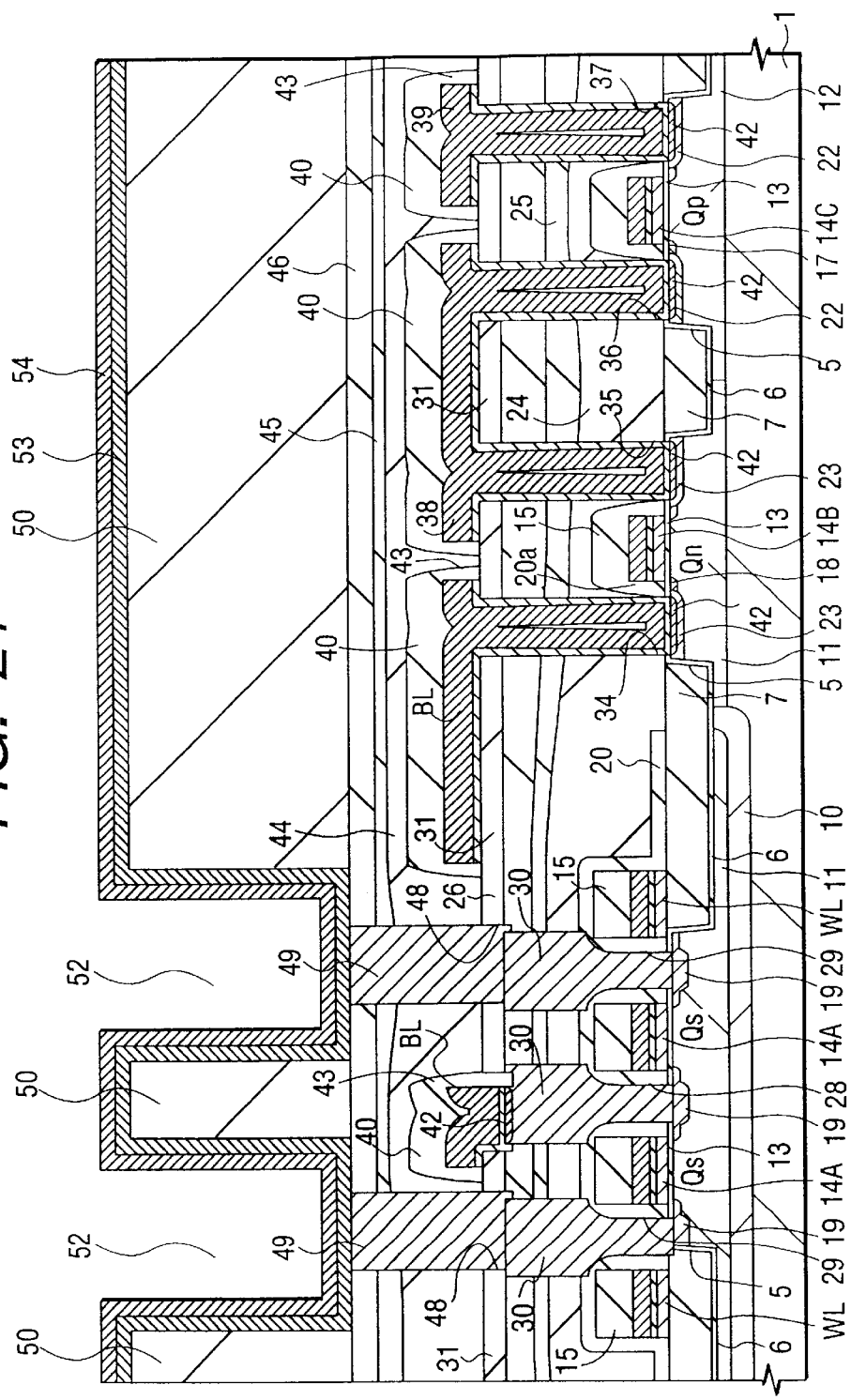

Next, while the semiconductor substrate 1 is held inside a reaction chamber of a CVD apparatus, the atmospheric air is introduced into the reaction chamber by leaking the reaction chamber. Thereafter, a second layer amorphous silicon film 54 is deposited as shown in FIG. 21. This amorphous silicon film 54 is deposited by CVD to a film thickness of 20 nm. Phosphorus (P) is doped in the dose of about $1.5 \times 10^{20}$ atoms/cm$^3$ into the amorphous silicon film 54 in the same way as above.

As will be explained later, the amorphous silicon film 54 is the raw material layer which grows to the granular silicon crystal and the granular crystal constitutes the surface portion of the lower electrode. Therefore, the impurity concentration is limited to a relatively low level of about $1.5 \times 10^{20}$ atoms/cm$^3$ so that the grain diameter of the granular crystal and its height can be easily controlled. The height of the granular crystal or in other words, the film thickness of the lower electrode, can be controlled by adjusting the film thickness of the amorphous silicon film 54. For example, the film thickness of the amorphous silicon film 54 is increased to increase the height of the granular crystal and is decreased to decrease the height. In this way, the height of the granular crystal can be regulated easily by adjusting the film thickness of the amorphous silicon film 54.

Incidentally, the concentration of the impurity introduced into the amorphous silicon films 53 and 54 is not limited to the value described above. The impurity concentration of the amorphous silicon film 53 is preferably high in order to secure conductivity of the lower electrode, but if the concentration is to high, doping cannot be executed and hinders crystallization in some cases. Therefore, the impurity concentration of the amorphous silicon film 53 is from $1 \times 10^{20}$ atoms/cm$^3$ to $1 \times 10^{22}$ atoms/cm$^3$. The impurity concentration of the amorphous silicon film 54 is preferably low in view of growth ability of the granular crystal. Therefore, the impurity concentration of the amorphous silicon film 53 is not higher than $5.0 \times 10^{20}$ atoms/cm$^3$, preferably not higher than $1.5 \times 10^{20}$ atoms/cm$^3$. In other words, it is important that the impurity concentration of the amorphous silicon film 54 is lower than that of the amorphous silicon film 53.

The film thickness of each of the amorphous silicon films 53 and 54 is not limited to the value given above. The amorphous silicon film 53 is preferably thick in order to secure conductivity of the lower electrode but if the thickness is too great, fine processing cannot be made. Therefore, the film thickness of the amorphous silicon film 53 is from 20 to 100 nm. The amorphous silicon film 54 is the raw material layer of the granular crystal as described above. Therefore, if the film thickness is too great, large granular crystal (having a large height) grow and are not preferable from the aspect of fine processing. However, the result of studies conducted by the present inventors has revealed that if the film thickness is too small, the granular crystal does not grow. Therefore, the film thickness of the amorphous silicon film 54 is at least 20 nm.

Figure 22:
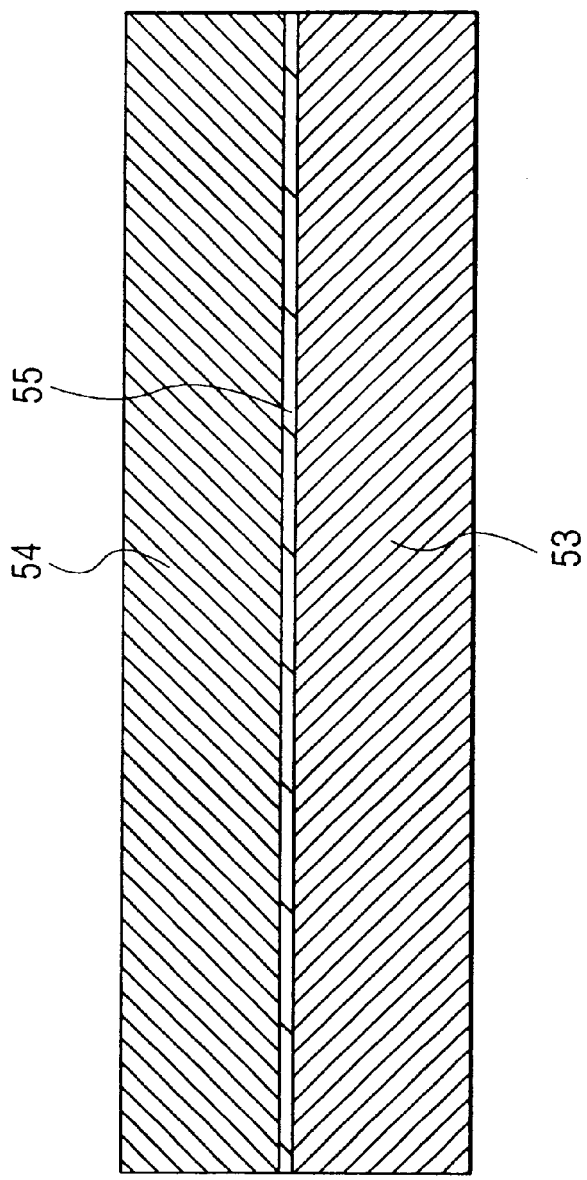

The first layer amorphous silicon film 53 is once exposed to the atmosphere before the deposition of the second layer amorphous silicon film 54 as described above. Therefore, a natural oxide film 55 is formed between the amorphous silicon films 53 and 54 as shown in FIG. 22.

The natural oxide film 55 has a film thickness of not greater than 2 nm. Though FIG. 22 shows this natural oxide film 55 as a continuous film for convenience sake, the film need not always be a continuous film but may be an island-like silicon oxide. As will be explained later, this natural oxide film 55 has an inhibitor function of limiting the feed source of the silicon atoms as the raw material of the granular crystal to only the amorphous silicon film 54, and inhibiting migration of the silicon atoms lest the silicon atoms contributing to the growth of the granular silicon crystal are supplied from the first layer amorphous silicon film 53. It may be an insulating film or a metal film.

Incidentally, this embodiment represents the case where the surface of the first layer amorphous silicon film 53 is exposed to the atmosphere to form the natural oxide film 55, but the inhibitor that inhibits the migration of the silicon atoms may be positively formed as the thin film or the adhering matter. It is possible, for example, to deposit a silicon oxide for an extremely short period of time, to use an oxidant such as ozone, to expose the first layer amorphous film to nitrogen oxide, or to execute plasma treatment in an oxidizing atmosphere or a UV irradiation treatment.

Figure 23:
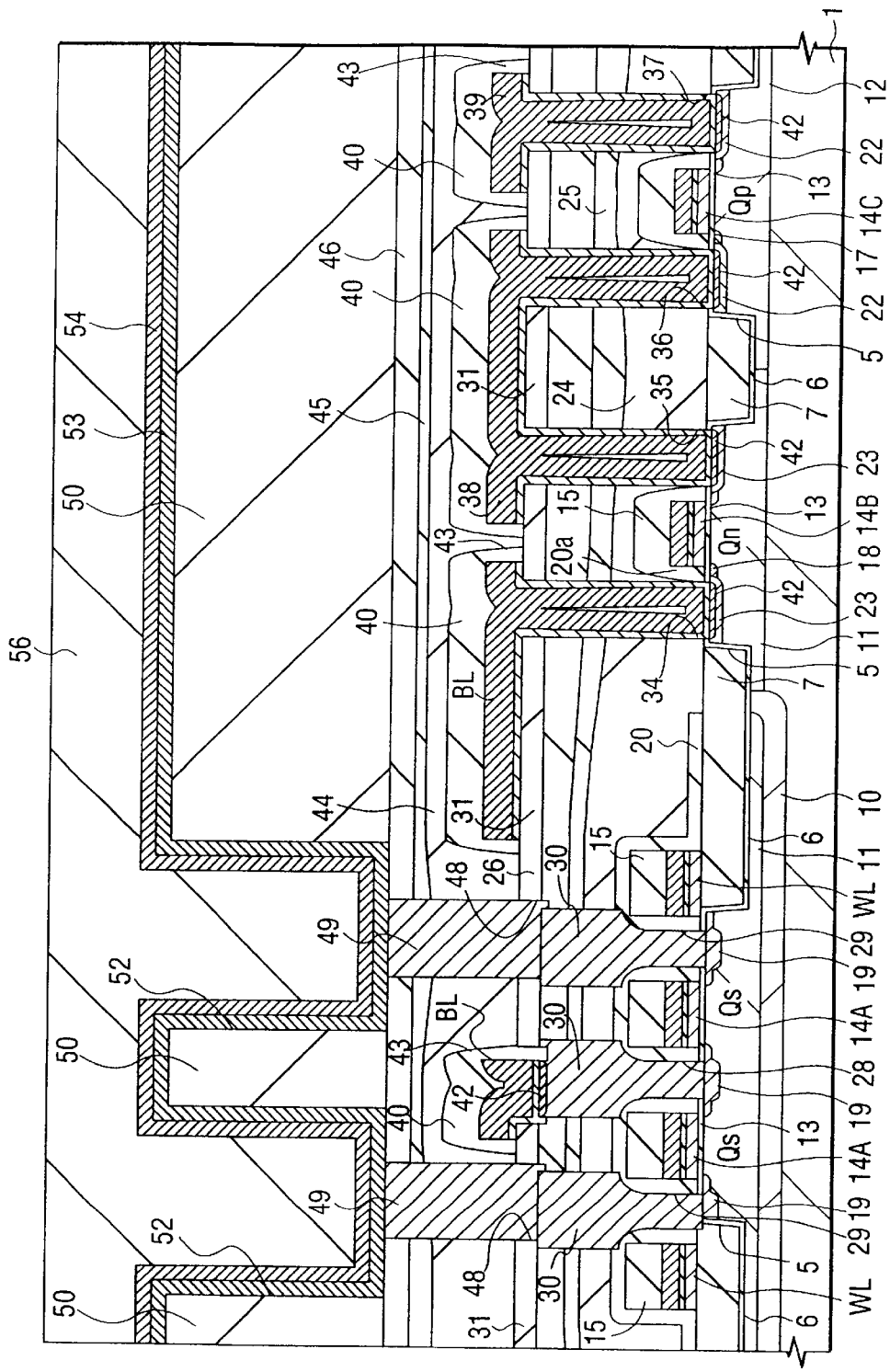

As shown in FIG. 23, an insulating film 56 for burying the trench 52 is deposited so that its surface becomes substantially flat and smooth. Since the insulating film 56 is later etched back and residues inside the trench 52 are removed by etching, the material of the insulating film 56 is preferably those which can be readily etched against the silicon oxide film 50 and have a large etching selection ratio. Examples of such materials are a SOG (Spin-On-Glass) film, an organic resin such as a resist, and so forth.

Figure 24:
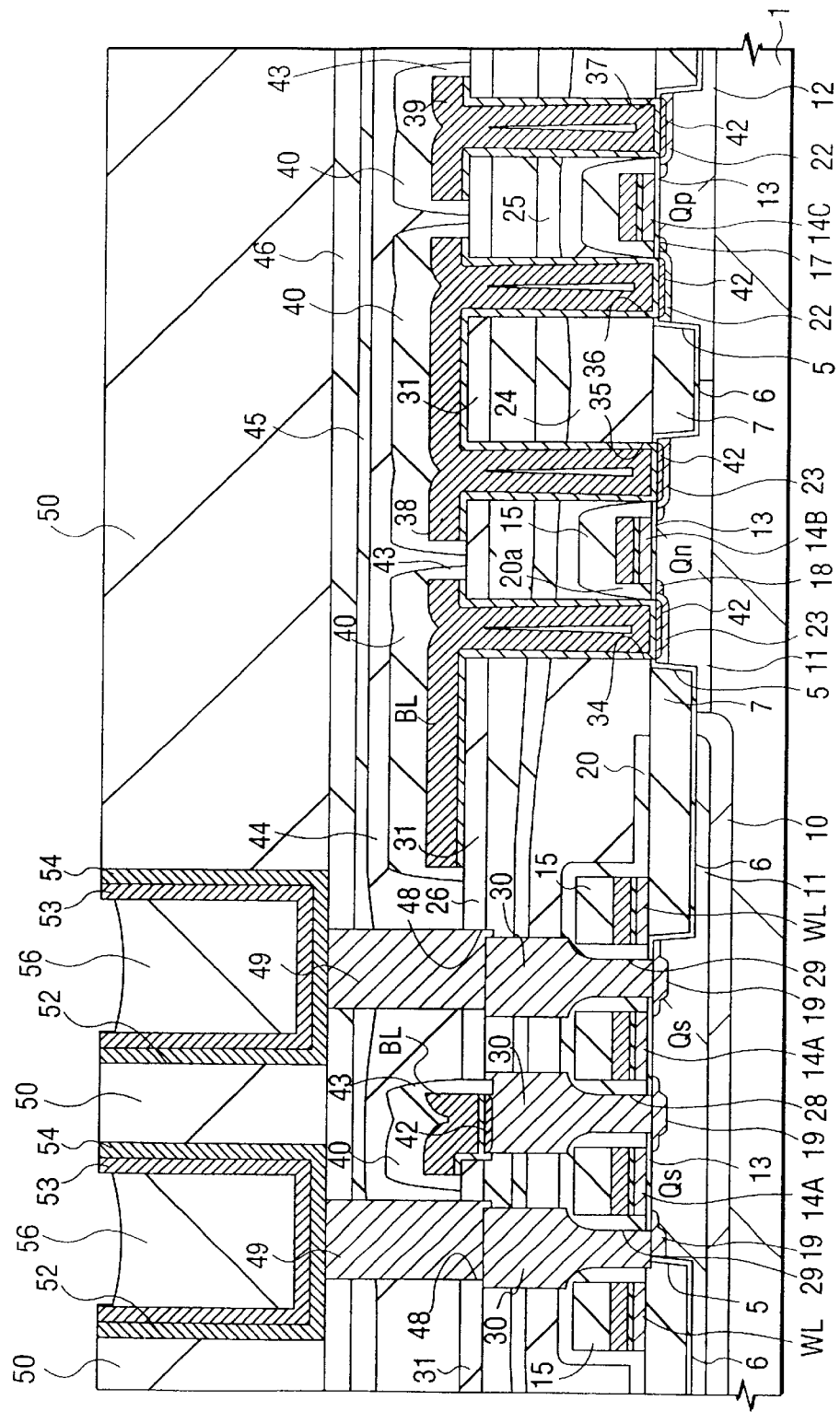

Next, as shown in FIG. 24, the insulating film 56 is etched back by dry etching. This etch-back is carried out until the amorphous silicon films 53 and 54 on the surface of the silicon oxide film 50 other than the trench 52 are etched. In this way, the laminate film of the cylindrical amorphous silicon films 53 and 54 is selectively left only inside the trench 52.

Figure 25:
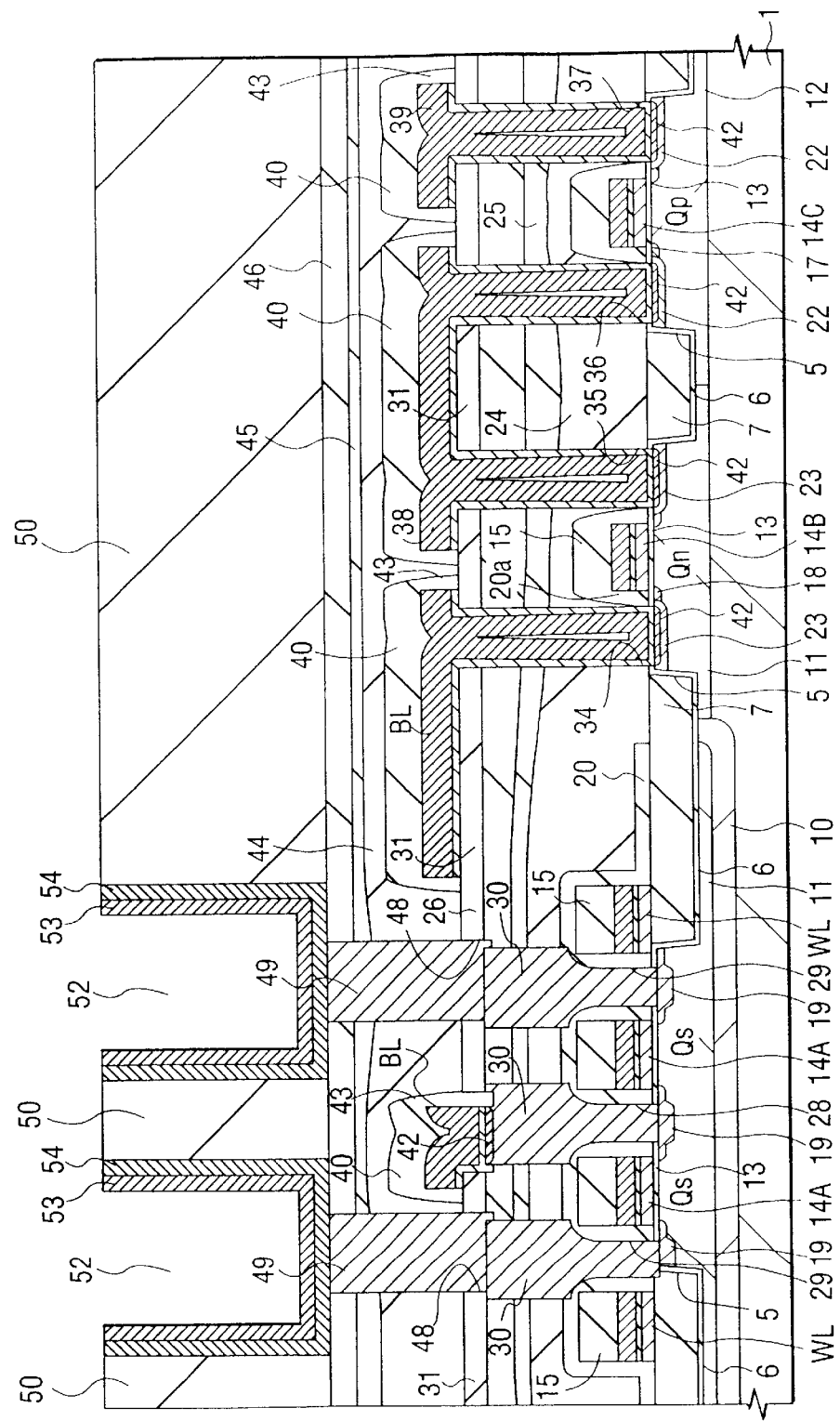

Subsequently, the insulating film 56 inside the trench 52 is removed by etching using a HF (hydrofluoric acid) type etching solution, for example, so as to expose the surface of the amorphous silicon film 54, as shown in FIG. 25.

Figure 26:
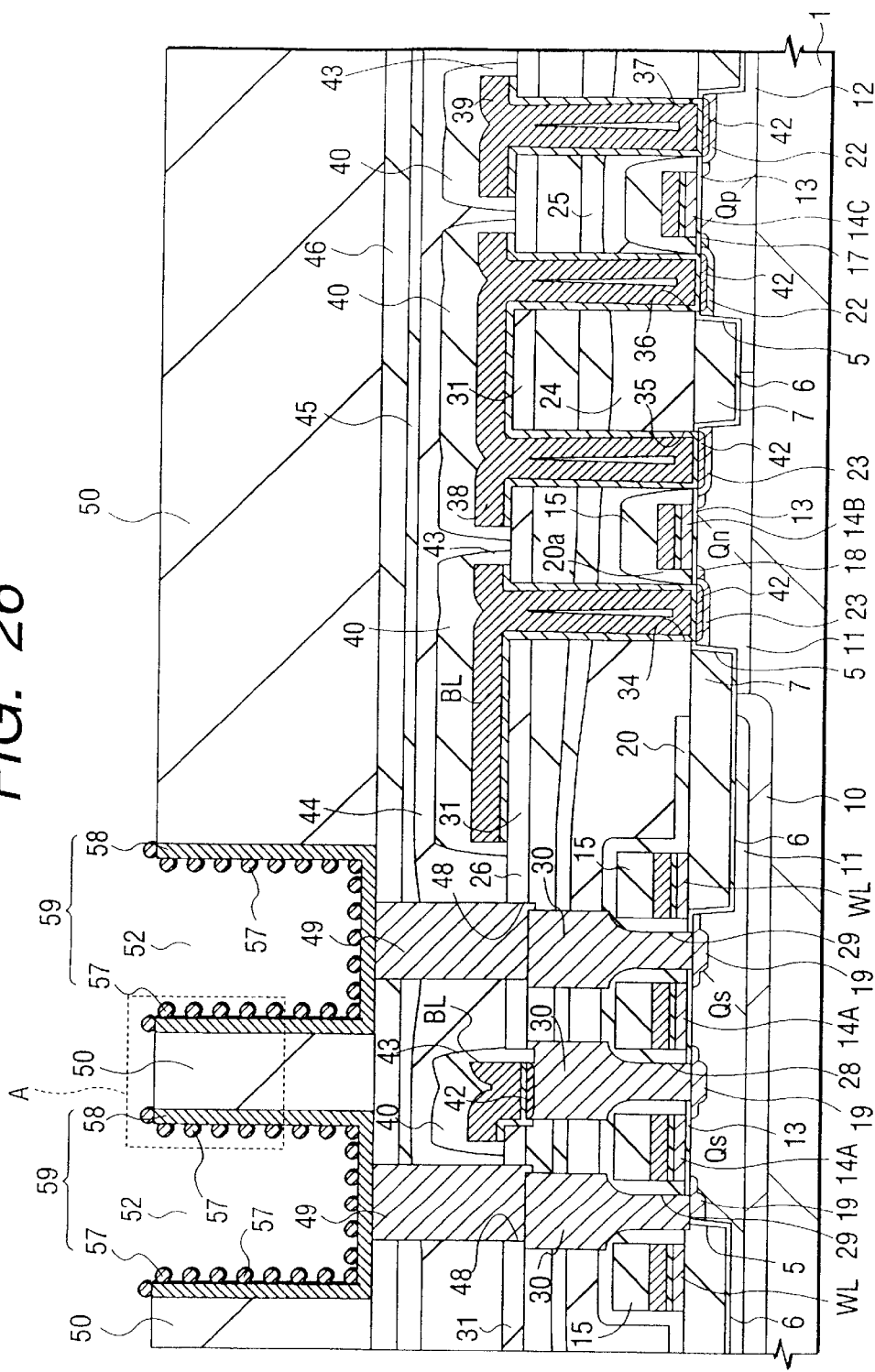

The amorphous silicon film 54 is then crystallized and the granular silicon crystal 57 is grown as shown in FIG. 26. The growth of the granular silicon crystal 57 is divided into the following two stages. The first is the silicon nucleus seeding stage and the second is a heat-treatment stage for promoting the grain growth of silicon. These two stages are continuously processed.

As to the silicon nucleus seeding condition, the semiconductor substrate 1 is held in a monosilane ($SiH_4$) gas atmosphere at a pressure of $1\times10^{-3}$ Torr at a treating temperature of 740° C. for a treating time of 60 seconds, for example. In this way, the silicon nucleus is formed on the surface of the amorphous silicon film 54. Next, the heat-treatment condition is a treating pressure of $1\times10^{-8}$ Torr, a treating temperature of 740° C. and a treating time of 150 seconds. The silicon grain grows under this condition.

The granular silicon crystal 57 grows by silicon supplied from the amorphous silicon film 54 but silicon is not supplied from the amorphous silicon film 53 as described above. For, the natural oxide film 55 as the inhibitor to the migration of silicon does not allow the migration of silicon from the amorphous silicon film 53. As a result, silicon is supplied from the amorphous silicon film 54 due to the heat-treatment described above, and the silicon nucleus generated on the surface grows while sucking silicon from the amorphous silicon film 54. When the amorphous silicon film 54 no longer exists or in other words, when silicon is fully supplied, the growth of the granular silicon crystal 57 stops at that point. This is believed the mechanism which can control the height of the granular silicon crystal 57 (the height of ruggedness) by the film thickness of the amorphous silicon film 54. Conventionally, the size (height) of the growing grains has been controlled by the heat-treatment time, but this embodiment can eliminate substantially completely the time factor and can adjust the height (size) of the granular silicon crystal 57 irrelevantly to the heat-treatment time. This is, in a sense, a self-completion type reaction which has extremely high controllability, enlarges a process window, stabilizes the fabrication steps and is extremely advantageous to the improvement in the robust property.

Next, heat-treatment is carried out at about 800° C. so as to crystallize the first layer amorphous silicon film 53 and to convert it to a polycrystalline silicon film 58. In this way is formed a lower electrode 59 comprising the polycrystalline silicon film 58 and the granular silicon crystal 57. Incidentally, the nucleus seeding condition and the condition of each heat-treatment given above are merely illustrative but in no way restrictive. For example, the conditions of the temperature and the treating time can be selected arbitrarily, and disilane ($Si_2H_6$) can be used in place of monosilane, for example.

Figure 27:
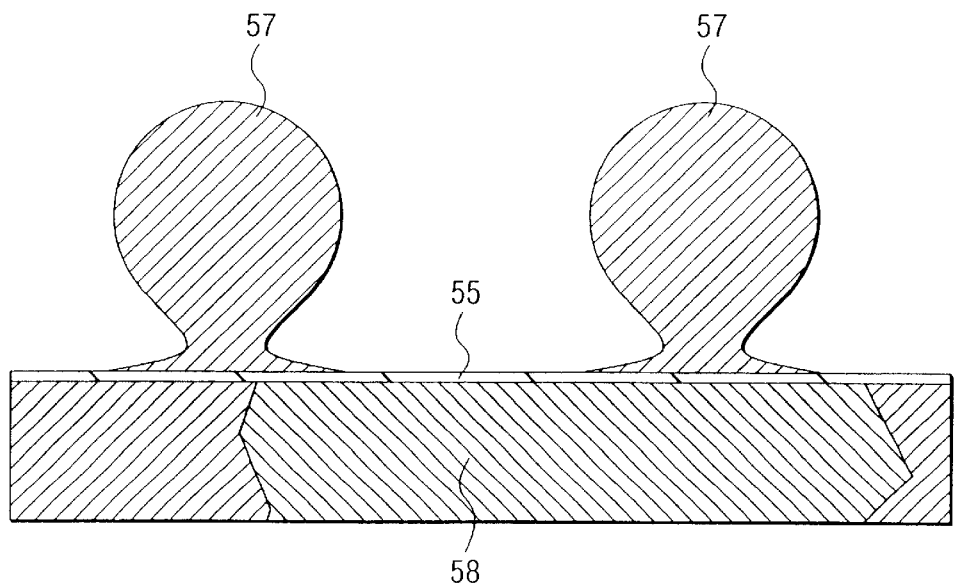
FIG. 27 is a sectional view showing schematically and in enlargement a part of a lower electrode.

FIG. 27 is an enlarged sectional view showing schematically a part of the lower electrode 59. The drawing shows the state where the granular silicon crystal 57 receives almost fully the supply of silicon from the amorphous silicon film 54 and its growth is complete. Therefore, the granular silicon crystal 57 does not continue and extend as a film but adheres to the surface of the polycrystalline silicon film 58. On the other hand, the polycrystalline silicon film 58 can secure sufficient conductivity as the crystals keep mutual contact at the grain boundary. Because silicon is not supplied from the amorphous silicon film 53, the decrease of its film thickness does not occur and the amorphous silicon film 53 retains its shape as-formed. Meanwhile, the polycrystalline silicon film 58 is crystallized due to the solid-phase growth from the amorphous silicon film 53. Therefore, the surface of the polycrystalline silicon film 58 is extremely flat and smooth and its surface coarseness (five-point mean coarseness, for example) is not greater than 10% of the film thickness of the polycrystalline silicon film 58. In other words, the film thickness of the polycrystalline silicon film 58 remains substantially constant at portions where the granular silicon crystal 57 is formed and portions between the former.

The plane orientation of the granular silicon crystal 57 is different from that of the polycrystalline silicon film 58. This represents that the granular silicon crystal 57 and the polycrystalline silicon film 58 are crystallized independently of one another without being affected by their crystallinity, and presumably results from the existence of the natural oxide film 55 as the inhibitor film.

Figure 28:
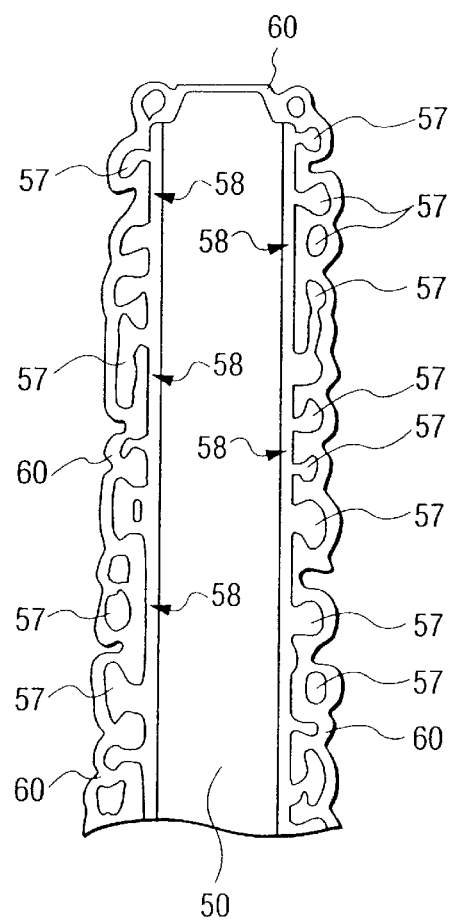
FIG. 28 is a schematic view of a SEM micrograph depicting the sectional shape of the lower electrode.

FIG. 28 is a schematic view of a micrograph of the sectional shape of the actual lower electrode when observed through an electron microscope (SEM). The portion shown in this FIG. 28 substantially corresponds to the portion A in FIG. 26. As shown in FIG. 26, it can be seen that the polycrystalline silicon film 58 formed by the crystallization of the first layer amorphous silicon film 53 is substantially flat and smooth (or in other words, has a constant film thickness along the side wall of the silicon oxide film 50), and that the granular silicon crystal 57 is formed in such a manner as to adhere to the surface of the flat polycrystalline silicon film 58. It can be appreciated also that the granular silicon crystal 57 is formed to a uniform height and is allowed to grow with extremely high controllability. Incidentally, the film depicted on the surface of the granular silicon crystal 57 is a capacitance insulating film 60 that will be explained next.

Incidentally, though the natural oxide film 55 is shown depicted like a continuous film in FIG. 27, the drawing does not intend to require the natural oxide film 55 as the actual film formed but illustrates it as the film only for convenience's sake. Therefore, the natural oxide film 55 may be practically a silicon oxide that is formed in the island shape, or an interface region devoid of the silicon oxide may exist, as well. Because the natural oxide film 55 is extremely thin, it cannot naturally be depicted in the schematic view of the SEM photograph shown in FIG. 28.

Figure 29:
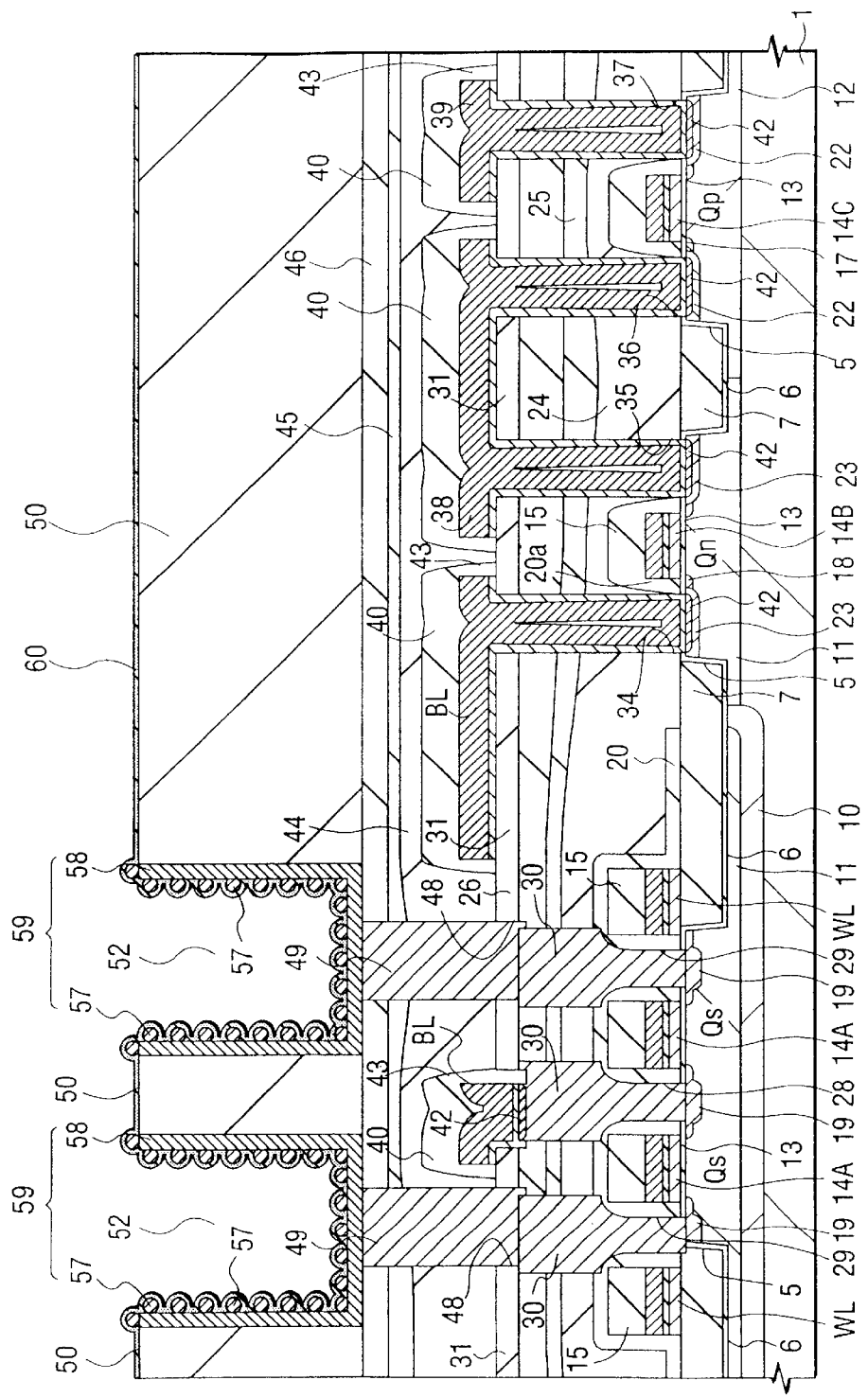

Next, as shown in FIG. 29, the capacitance insulating film (dielectric film) 60 is formed over the entire surface of the semiconductor substrate 1. The capacitance insulating film 60 may comprise a laminate film of a silicon oxide film, a silicon nitride film and a silicon oxide film formed by CVD, for example. In this instance, the surface of the lower electrode may be heat-treated and nitrided in an ammonia atmosphere, for example, before the capacitance insulating film 60 is formed, in order to prevent the oxidation of the lower electrode surface by the silicon oxide film.

A tantalum oxide film, too, can be used for the capacitance insulating film 60. Alternatively, a polycrystalline tantalum oxide film may be formed by depositing an amorphous tantalum oxide film by CVD, and heat-treating and crystallizing this film in an oxygen atmosphere. In this case, too, the surface of the lower electrode may be nitrided by heat-treatment in an ammonia atmosphere, for example, before the formation of the capacitance insulating film 60 in order to prevent oxidation of the lower electrode surface.

Figure 30:
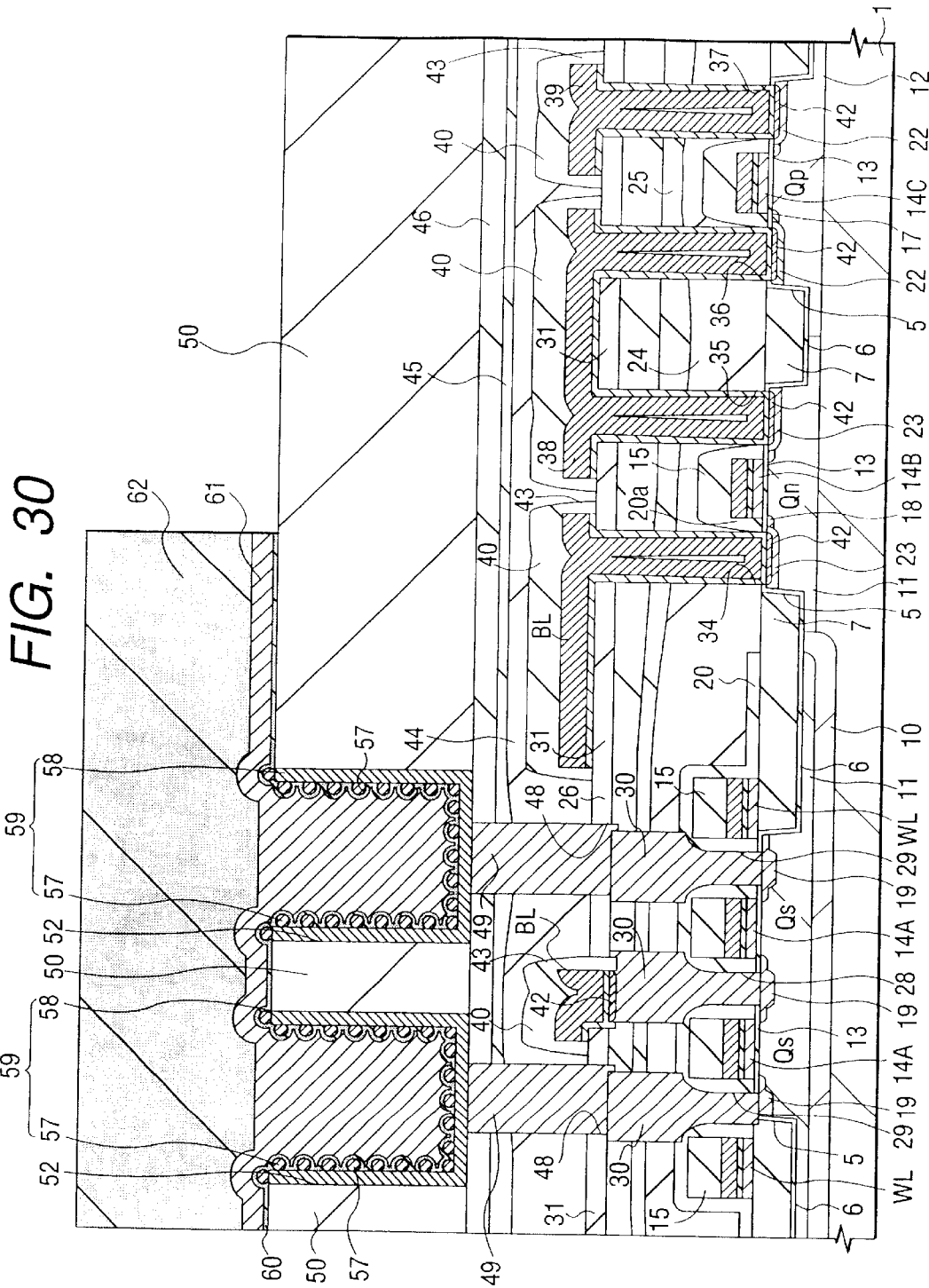

Next, a conductor film 61 to serve as an upper electrode is deposited on the capacitance insulating film 60, and this conductor film 61 and the capacitance insulating film 60 are etched, as shown in FIG. 30, using a photoresist film 62 as the mask. Examples of the conductor film 61 include a polycrystalline silicon film, a tungsten nitride film, a tungsten film and a titanium nitride film.

Figure 31:
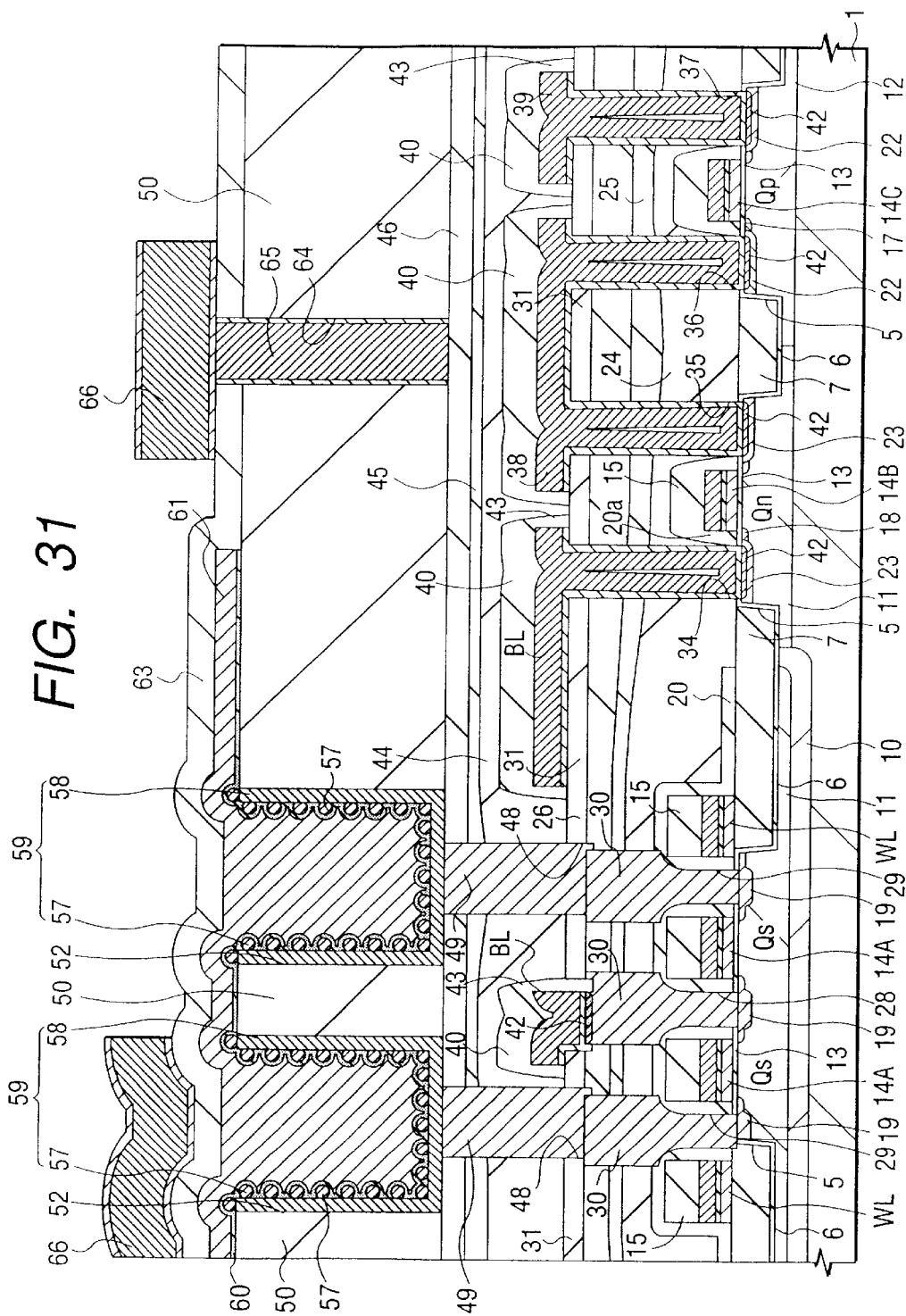

After the photoresist 62 is removed, an about 40 nm-thick silicon oxide film 63 is deposited on the information storing capacitance device C as shown in FIG. 31. The silicon oxide film 63 is deposited by CVD using ozone ($O_3$) and tetraethoxysilane (TEOS) as a source gas, for example. Thereafter, the insulating film over the first layer wiring 38 of the peripheral circuit is removed by dry etching using the photoresist film as the mask, thereby forming through-holes 64. A plug 65 is then formed inside each through-hole 64. Subsequently, a second layer wiring 66 is formed on the silicon oxide film 63. The plug 65 is formed by depositing an about 100 nm-thick TiN film by sputtering on the silicon oxide film 63, depositing further an about 500 nm-thick W film by CVD and etching batch these films in such a manner to leave them inside the through-hole 64. The second layer wiring 66 is formed by depositing an about 50 nm-thick TiN film, an about 500 nm-thick Al (aluminum) film and an about 50 nm-thick Ti film by sputtering on the silicon oxide film 63, and patterning these films by dry etching using a photoresist film as a mask.

Thereafter, a third layer wiring is formed through an inter-level insulating film, and a passivation film comprising a silicon oxide film and a silicon nitride film is deposited on the third layer wiring. However, this passivation film is omitted from the drawings. The DRAM according to this embodiment is completed by the process steps described above.

Incidentally, the third layer wiring and the plug connected to the former can be formed in the same way as the second layer wiring, and the inter-level insulating film may comprise an about 300 nm-thick silicon oxide film, an about 400 nm-thick SOG film and an about 300 nm-thick silicon oxide film. The silicon oxide film can be deposited by plasma CVD using ozone ($O_3$) and tetraethoxysilane (TEOS) as a source gas, for example.

This embodiment can form the granular silicon crystal 57 with high controllability, and can therefore provide the polycrystalline silicon film having the granular silicon crystal corresponding to ruggedness formed by fine etching process.

Because the polycrystalline silicon film 58 can keep its film thickness irrespective of the growth of the granular silicon crystal 57, conductivity of the lower electrode 59 can be secured sufficiently. This conductivity can be kept at a satisfactory level by adjusting the dose of the impurity into the amorphous silicon film 53 to serve as the polycrystalline silicon film 58, too.

The introduction of a large dose of the impurity into the polycrystalline silicon film 58 has also the function of restricting the formation of the depletion layer of the lower electrode 59. In other words, the impurity in large amounts is introduced into the polycrystalline silicon film 58 constituting the lower electrode 59, while the amount of the impurity to be introduced into the granular silicon crystal 57 is lowered in view of its inhibition factor of the growth. When the high temperature thermal process such as the formation step of the capacitance insulating film 60 is carried out, however, the impurity in the polycrystalline silicon film 58 is sufficiently activated or the diffusion of the impurity from the polycrystalline silicon film 58 into the granular silicon crystal 57 develops. The increase of the impurity concentration after the grain growth does not at all affect crystallinity but can rather restrict the drop of the capacitance value by limiting the formation of the depletion layer.

Figure 32:
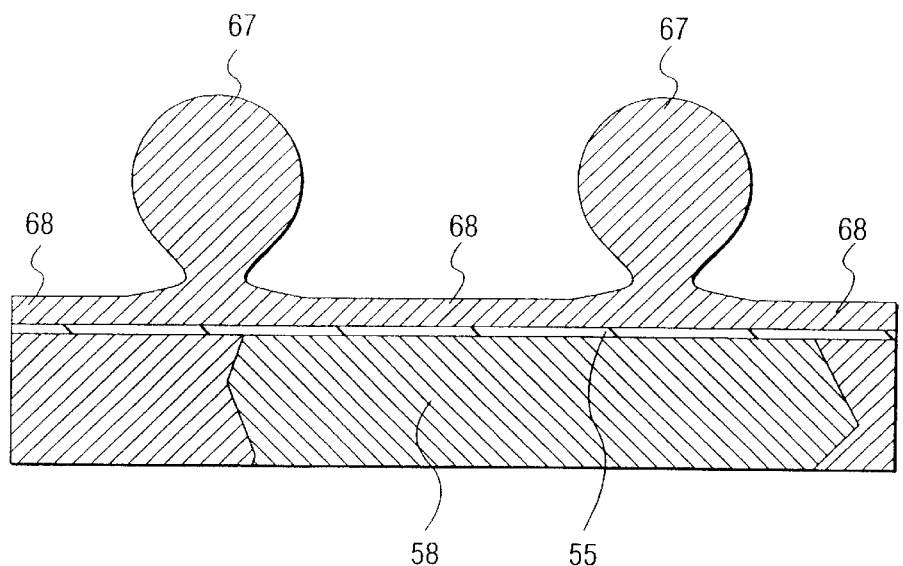
FIG. 32 is a sectional view showing in enlargement another fabrication process of the DRAM according to the embodiment 1.

Incidentally, this embodiment represents the case where the amorphous silicon film 54 fully grows to the granular silicon crystal 57, but a part of the amorphous silicon film 54 may grow to the granular silicon crystal 67 with the other remaining as the polycrystalline silicon film 68, as shown in FIG. 32.

Embodiment 2

Figure 33A:
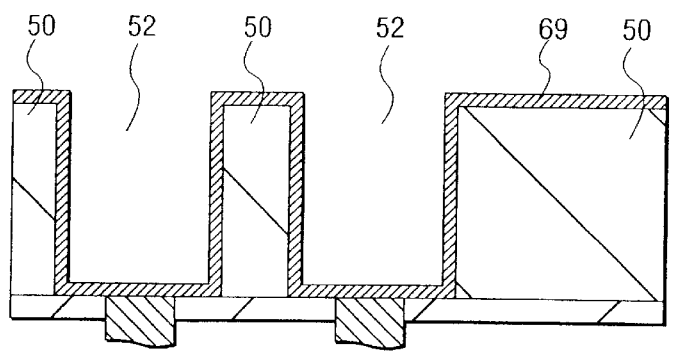
FIGS. 33 to 35 are sectional views showing step-wise an example of a fabrication process of a DRAM according to an embodiment 2 of the present invention.
Figure 34B:
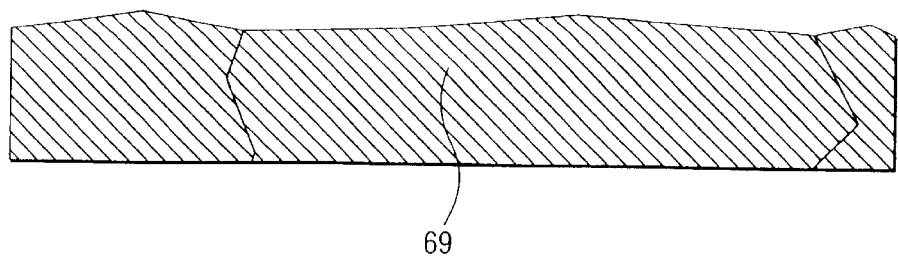
Figure 34A:
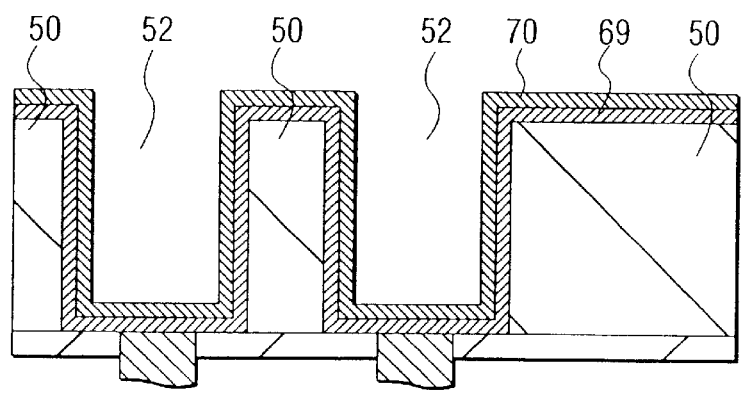
Figure 34B:
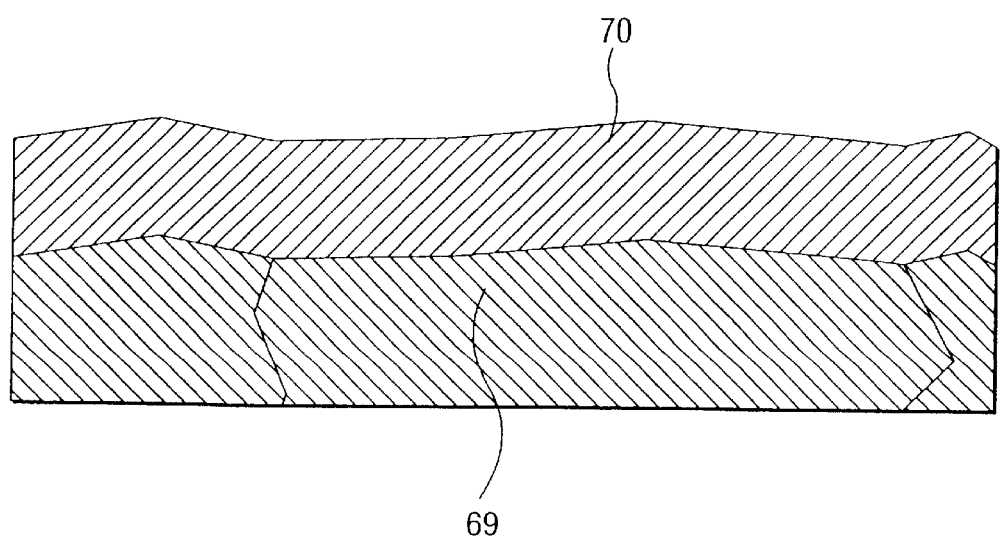
Figure 35A:
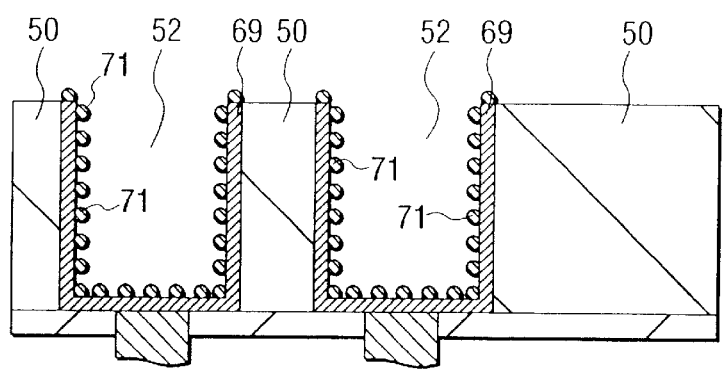
Figure 35B:
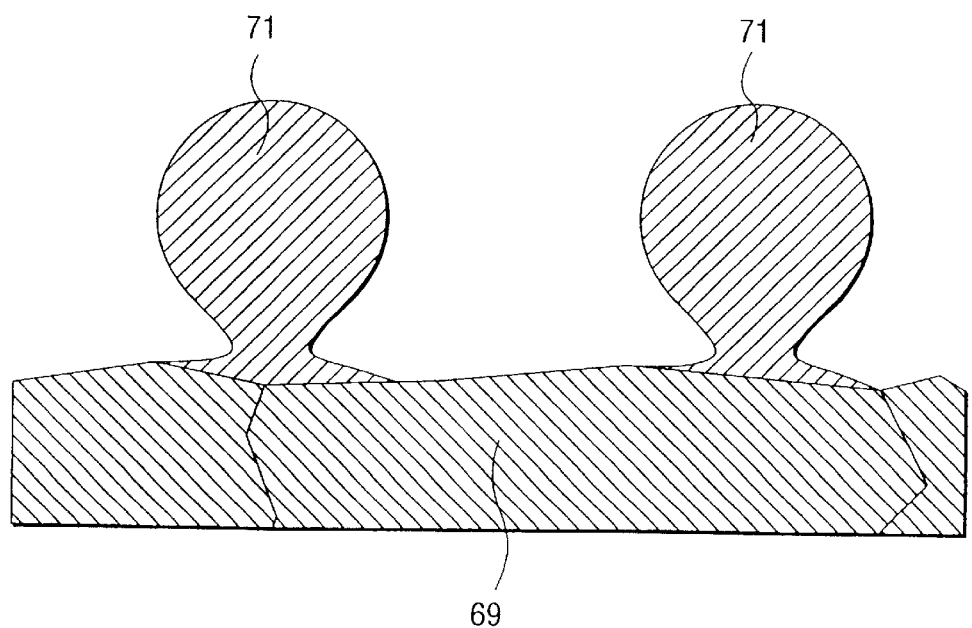

FIGS. 33 to 35 are sectional views showing step-wise an example of the fabrication steps of the DRAM according to the embodiment 2. In FIGS. 33 to 35, (a) is an enlarged sectional view of the information storing capacitance device of the DRAM and (b) is an enlarged sectional view of a part of the lower electrode that constitutes the information storing capacitance device.

The DRAM of this embodiment 2 is the same in its circuit construction and its planar construction as the DRAM shown in FIGS. 1 and 2. As to the construction of the information storing capacitance device C, it is similar to the section of the embodiment 1 with the exception of the different portions. Therefore, the following explanation will be given on only the different portions, and the explanation of the similar portions will be omitted.

The fabrication method of the DRAM according to the embodiment 2 is the same as that of the embodiment 1 up to the process step shown in FIG. 19. Thereafter, a polycrystalline silicon film 69 is formed in such a manner as to cover the inside of the trench 52 of the silicon oxide film 50 as shown in FIG. 33(a). In the embodiment 1, the amorphous silicon film 53 is deposited and is later heat-treated for crystallization but in this embodiment 2, the polycrystalline silicon film 69 is deposited by CVD in such as manner as to form the polycrystalline silicon film as-deposited. Therefore, ruggedness resulting from the grains of the polycrystalline silicon film is created to a certain extent on the surface as shown in FIG. 33(b).

Next, an amorphous silicon film 70 is deposited on the polycrystalline silicon film 69 as shown in FIG. 34(a). The natural oxide film is not formed in this embodiment 2, as shown in FIG. 34(b).

The polycrystalline silicon film 69 and the amorphous silicon film 70 are allowed to remain only inside the trenches-52 in the same way as in the process steps of the embodiment 1 shown in FIGS. 23 and 24, and as shown in FIG. 35(a) the amorphous silicon film 70 is then heat-treated for silicon nucleus seeding same as in the embodiment 1 and for promoting the grain growth, thereby growing the granular silicon crystal 71.

In this embodiment, the oxide film as the inhibitor film is not formed. However, because the amorphous silicon film 70 as the raw material layer of the granular silicon crystal 71 is formed on the polycrystalline silicon film 69, silicon is not supplied from the polycrystalline silicon film 69 during the growth of the granular silicon crystal 71. Therefore, even though the inhibitor layer is absent, the granular silicon crystal 71 having high controllability can be obtained.

Incidentally, the film thickness of each of the polycrystalline silicon film 69 and the amorphous silicon film 70, and its impurity concentration, are the same as those of the embodiment 1.

Because the granular silicon crystal 71 is grown by supplying silicon from the amorphous silicon film 70 formed on the crystallized polycrystalline silicon film 69, the film thickness of the polycrystalline silicon film 69 can be kept unaltered even after the granular silicon crystal 71 has grown up fully as shown in FIG. 35(*b*), and required conductivity can be secured by this polycrystalline silicon film 69.

Figure 36:
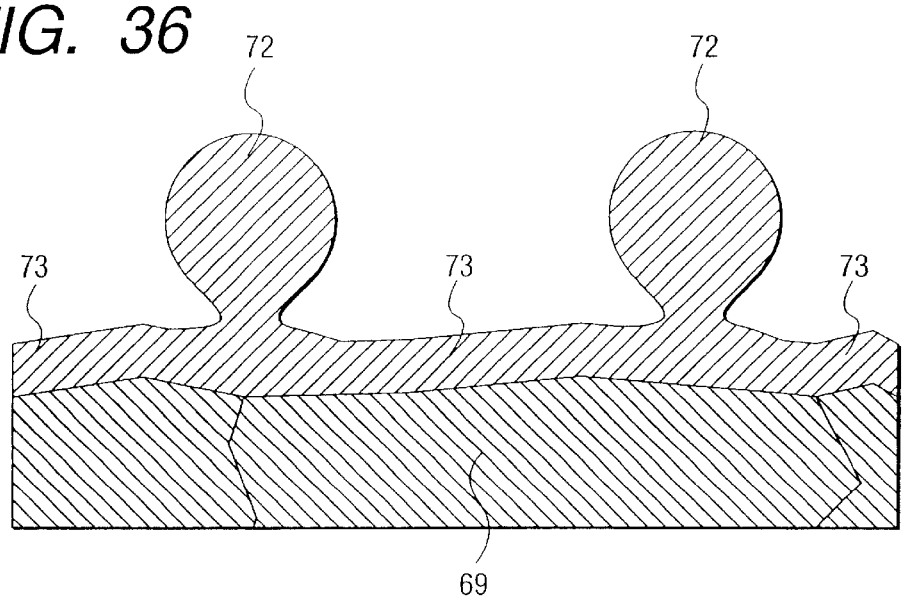
FIG. 36 is a sectional view showing another example of the fabrication process of the DRAM according to the embodiment 2.

Incidentally, a part of the amorphous silicon film 70 may grow to the granular silicon crystal 72 with the other part remaining as the polycrystalline silicon film 73 as shown in FIG. 36.

Embodiment 3

Figure 37A:
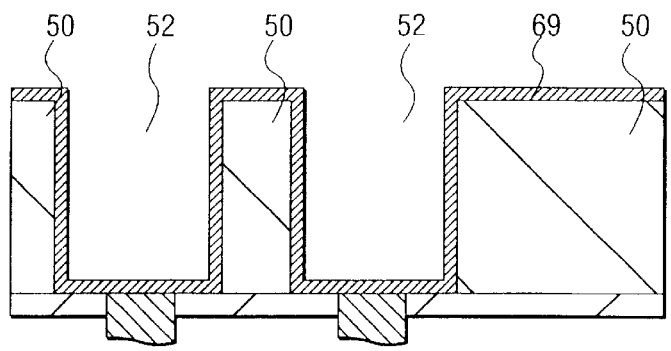
FIGS. 37 to 40 are sectional views showing stepwise an example of a fabrication process of a DRAM according to an embodiment 3 of the present invention.
Figure 37B:
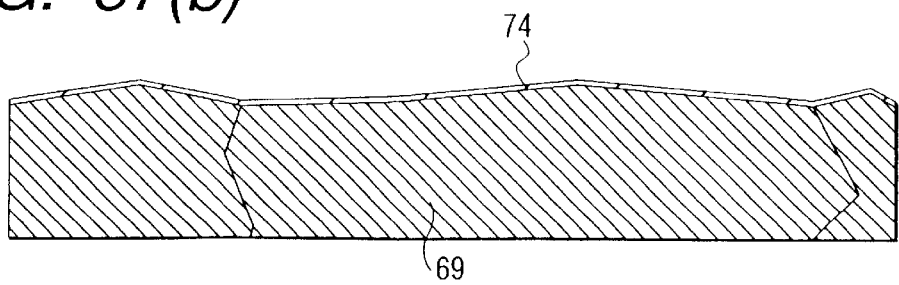
Figure 38A:
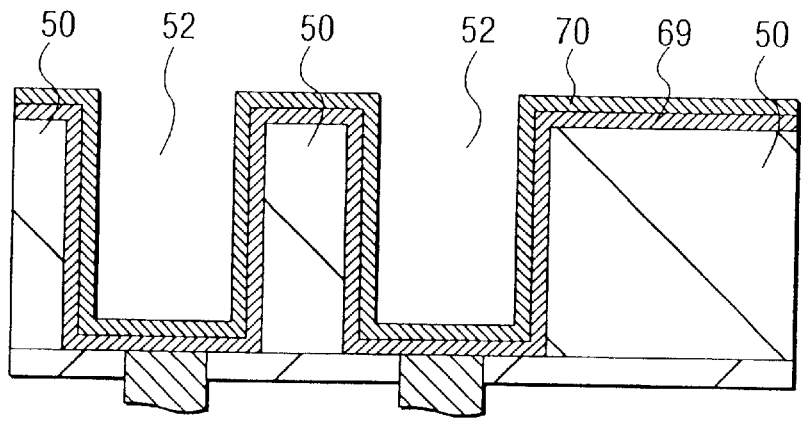
Figure 38B:
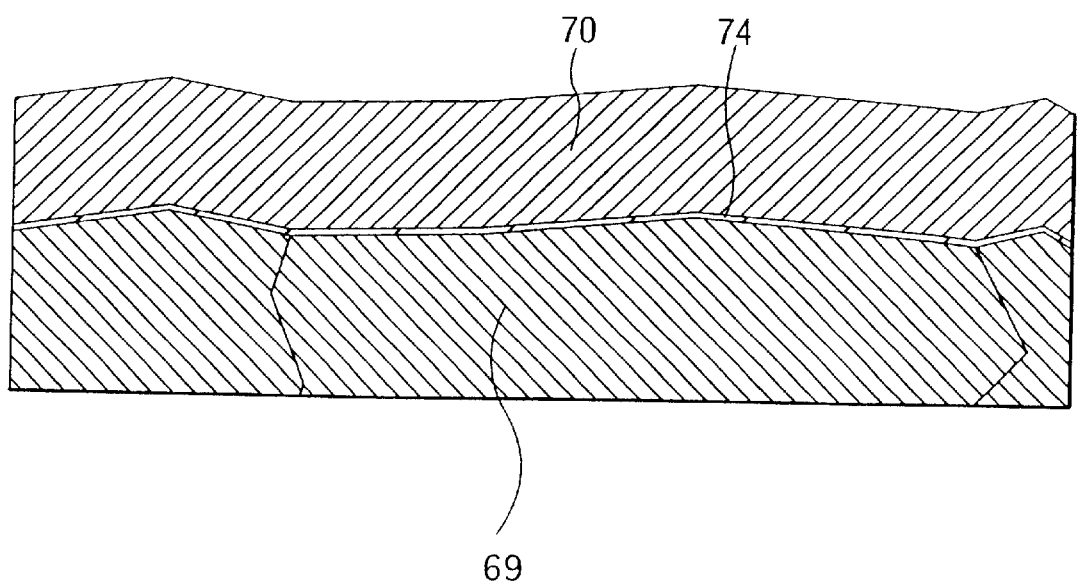
Figure 39A:
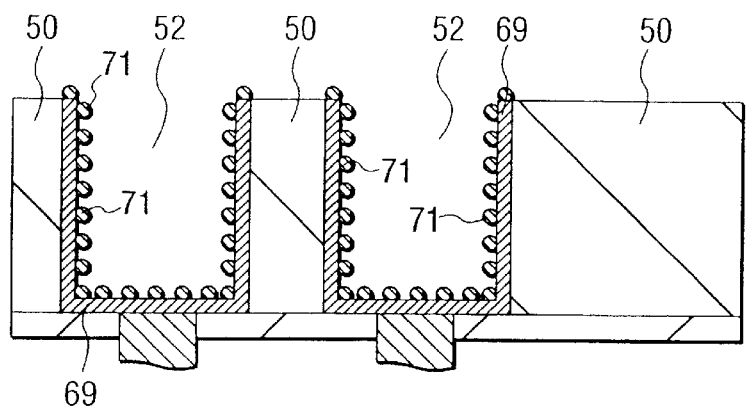
Figure 39B:
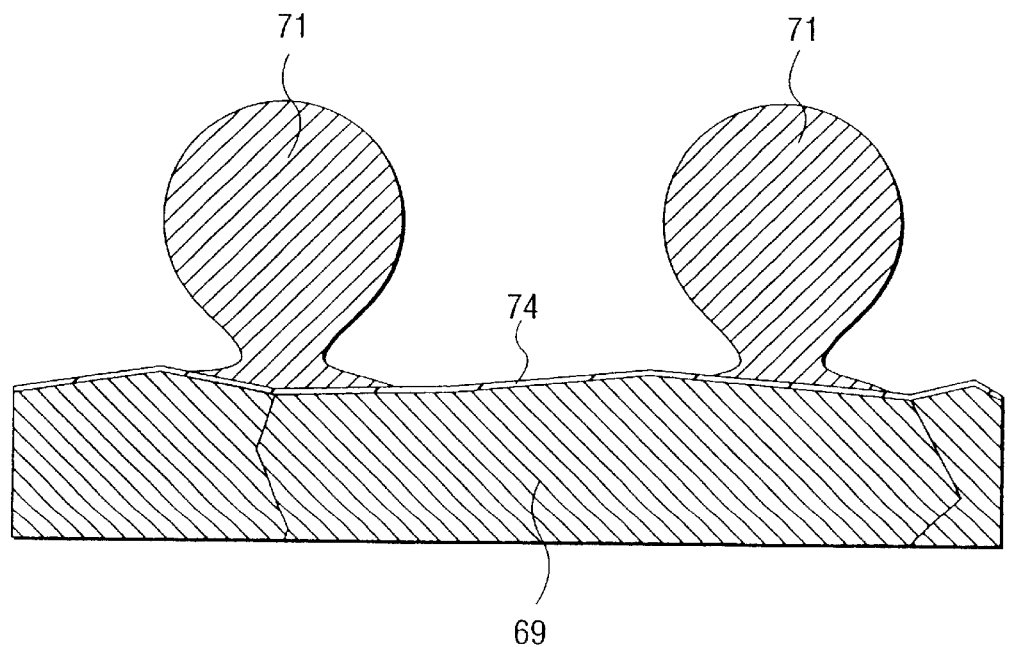

FIGS. 37 to 39 are sectional views showing step-wise the fabrication process of the DRAM according to the embodiment 3. In FIGS. 37 to 39, (a) is an enlarged sectional view of the portion of the information storing capacitance device of the DRAM and (b) is an enlarged sectional view of a part of the lower electrode that constitutes the information storing capacitance device.

The fabrication method of this embodiment is the same of the fabrication method of the embodiment 2 except that the natural oxide film as the inhibitor film is formed in the fabrication method of the embodiment 2. Therefore, the explanation will be given on only the different portions, and the explanation of the similar portions will be omitted.

A polycrystalline silicon film 69 is formed in the same way as in FIG. 33 of the embodiment 2. Thereafter, the natural oxide film 74 is formed by leaking the reaction chamber to the open air and exposing the surface of the polycrystalline silicon film 69 to the open air as shown in FIG. 37.

Next, an amorphous silicon film 70 is formed in the same way as in the embodiment 2 as shown in FIG. 38. Since the natural oxide film 74 is formed in this embodiment, possible homo-epitaxial growth reflecting crystallinity of the polycrystalline silicon film 69 does not occur at the time of deposition of the amorphous silicon film 70. In other words, the homo-epitaxial growth occurs depending on the deposition condition of the amorphous silicon film 70, and a micro-crystal is possibly contained in the amorphous silicon film 70. However, such a possibility is extremely low in this embodiment. In other words, the natural oxide film 74 functions as a film that impedes the epitaxial growth (crystallization) of the amorphous silicon film 70.

Next, the polycrystalline silicon film 69 and the amorphous silicon film 70 are allowed to remain only inside the trenches 52 in the same way as in the embodiment 2 as shown in FIG. 39, and the amorphous silicon film 70 is grown to the granular silicon crystal 71.

Since the natural oxide film 74 as the crystallization inhibition film is formed in this embodiment, the amorphous silicon film 70 can be deposited substantially completely as the amorphous film and the granular silicon crystal 71 can be grown reliably.

Needless to say, it is possible to stop the growth of the granular silicon crystal 71 halfway and to convert it to the polycrystalline silicon film having granular portions in the same way as in the embodiments 1 and 2.

Embodiment 4

FIGS. 40 to 43 are sectional views showing stepwise an example of the fabrication process of the DRAM according to the embodiment 4 and are enlarged sectional views showing the portion of the information storing capacitance device of the DRAM.

The DRAM of this embodiment is the same in its circuit construction and planar construction as the DRAM shown in FIGS. 1 and 2, and its section is the same as that of the embodiment 1 with the exception of the construction of the information storing capacitance device C. Therefore, the explanation will be given on only the different portions, and the explanation of the similar potions will be omitted.

Figure 40:
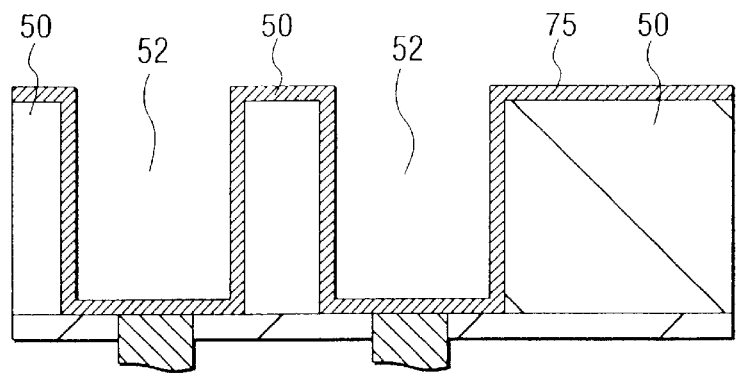
Figure 41:
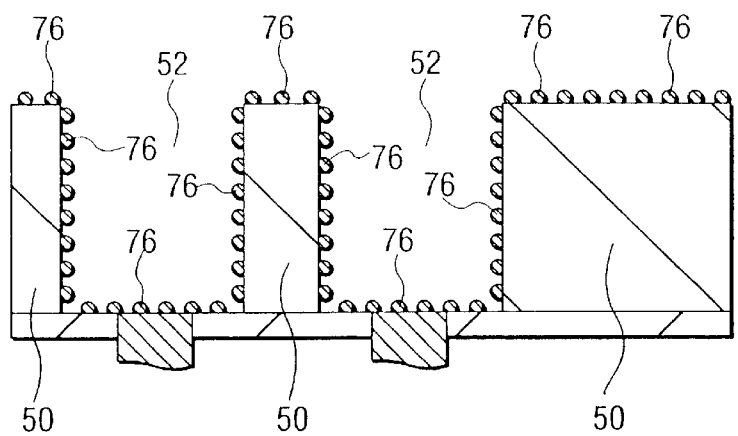
FIGS. 41 to 46 are sectional views showing stepwise an example of a fabrication process of a DRAM according to an embodiment 4 of the present invention.

The fabrication method of the DRAM of this embodiment is the same as that of the embodiment 1 up to the process step shown in FIG. 19. Thereafter, an amorphous silicon film 75 is formed in such a manner as to cover the inside of the trenches 52 of the silicon oxide film 50 as shown in FIG. 40. In the embodiment 1, the amorphous silicon film is further deposited, but in this embodiment, the amorphous silicon film 75 is grown granularly at this stage to form the granular silicon crystal 76 as shown in FIG. 41. Since one layer of the amorphous silicon film 75 is grown to the granular silicon crystal 76, the granular silicon crystal 76 can be formed with high controllability without the necessity for considering crystallinity of the base or the interposition of the inhibitor film.

Figure 42:
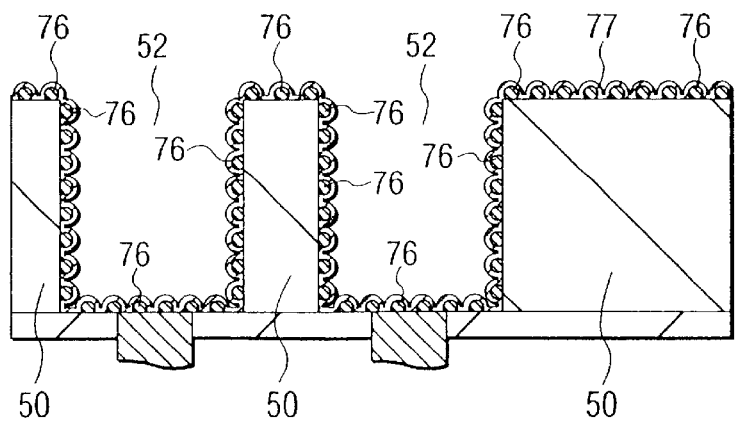

Next, the polycrystalline silicon film 77 is deposited over the entire surface as shown in FIG. 42. This polycrystalline silicon film 77 may be formed by depositing the amorphous silicon film and then subjecting this film to the solid phase growth.

Figure 43:
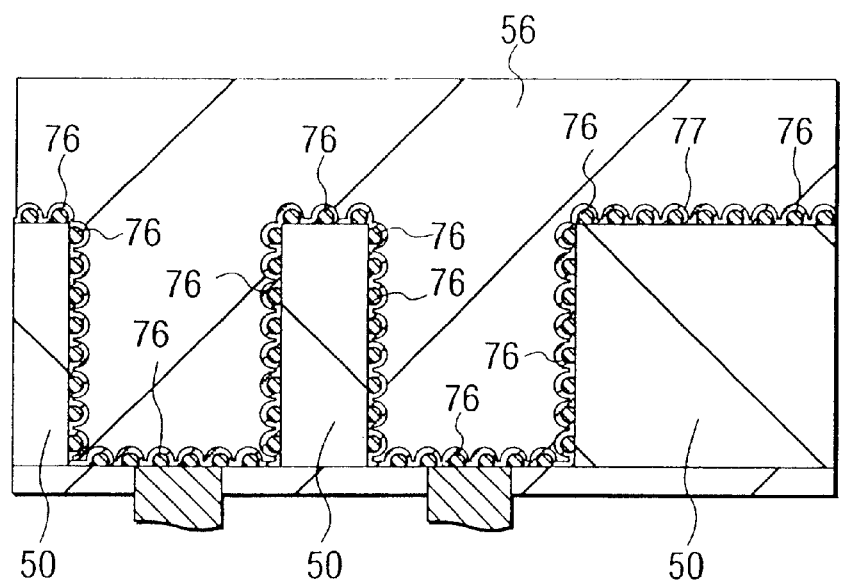
Figure 44:
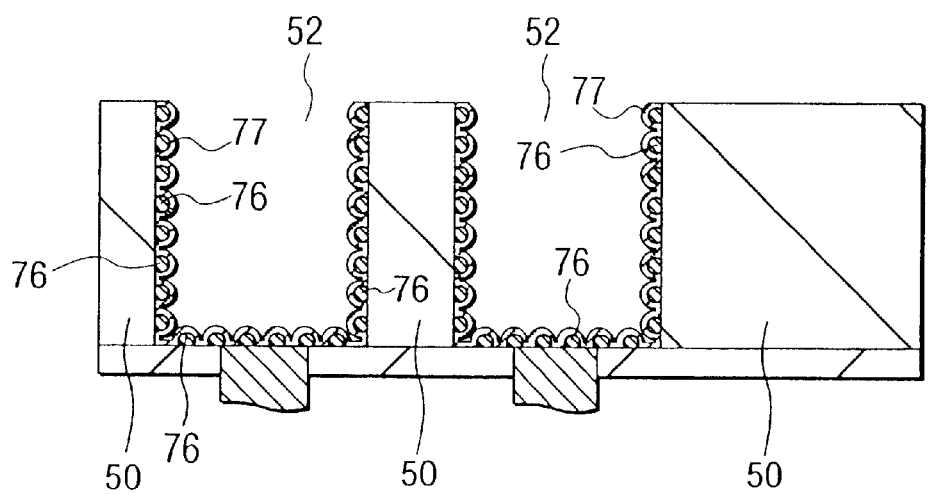

The insulating film 56 for burying the trenches 52 is formed in the same way as in the embodiment 1 as shown in FIG. 43, and the insulating film 56 is, as shown in FIG. 44, etched back in the same way as in the embodiment 1 so as to remove the polycrystalline silicon film 77 and the granular silicon crystal 76 over the silicon oxide film 50. The insulating film 56 remaining in the trench 52 is also removed.

In this way, the lower electrode comprising the polycrystalline silicon film 77 and the granular silicon crystal 76 is formed. The subsequent process steps are the same as those of the embodiment 1.

According to this embodiment, the granular silicon crystal 76 can be formed with high controllability without the necessity for considering crystallinity of the base and the interposition of the inhibitor film, and conductivity of the lower electrode can be secured by the polycrystalline silicon film 77. The amorphous silicon film 75 corresponds to the amorphous silicon film 54 in the embodiment 1 while the polycrystalline silicon film 77 corresponds to the amorphous silicon film 53 of the embodiment 1. The values of the film thickness and the impurity concentration in the embodiment 1 can be applied as such to the corresponding values of these films.

Figure 45:
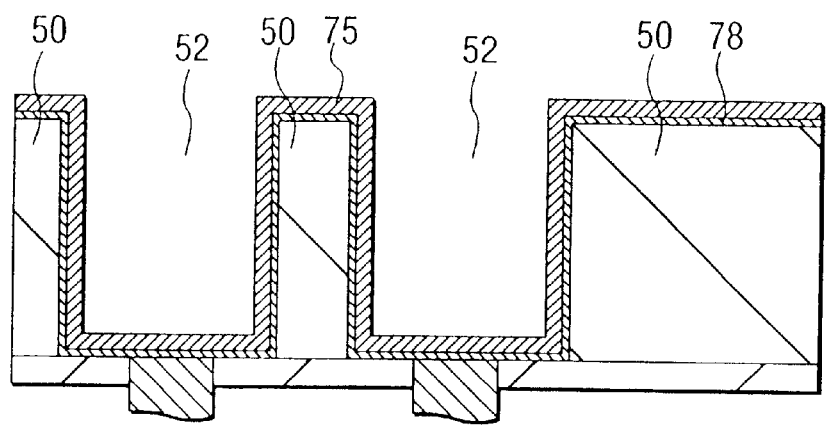

Incidentally, it is possible in this embodiment to form an adhesive film 78 before the deposition of the amorphous silicon film 75 as shown in FIG. 45. The adhesive film 78 can improve adhesion of the granular silicon crystal 76 to the silicon oxide film 50 by crystallization of the amorphous silicon film 75. A polycrystalline silicon film, for example, can be used for the adhesive film 78 and the film may be a thin film having a thickness of not greater than 20 nm.

Figure 46:
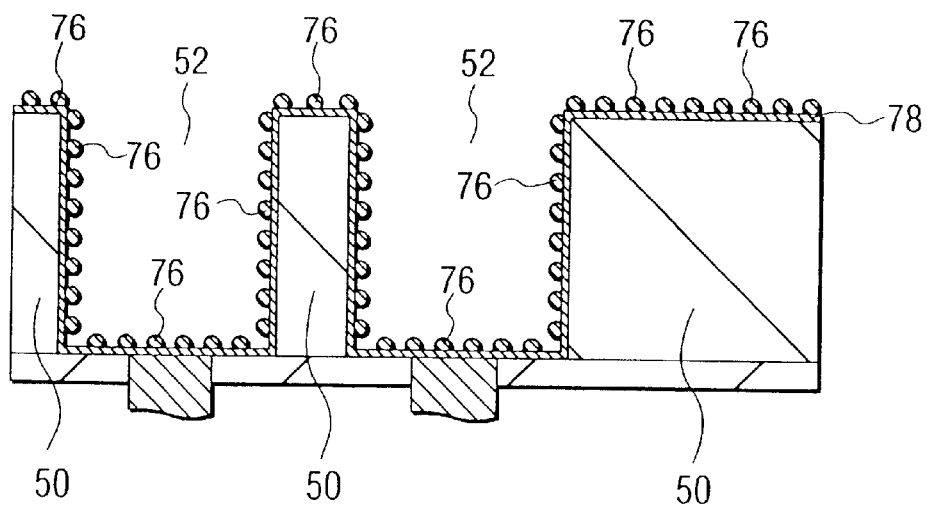

After the growth of the granular silicon crystal 76 due to crystallization of the amorphous silicon film 75, the granular silicon crystal 76 adheres to the silicon oxide film 50 through the adhesive layer 78 as shown in FIG. 46 and does not easily peel. Incidentally, an inhibitor film such as the natural oxide film is formed on the interface between the adhesive film 78 and the amorphous silicon film 75.

Although this invention has thus been described concretely with reference to preferred embodiments thereof, the invention is not particularly limited to these embodiments but can be naturally changed or modified in various ways without departing from the scope thereof.

For example, the cylindrical lower electrode is illustrated in the foregoing embodiments as the lower electrode of the information storing capacitance device, the lower electrode of other types such as a stacked type, a fin type, etc., can also be used.

In the embodiment 2, the polycrystalline silicon film is shown as the example of the first layer of the lower electrode, but the first layer is not limited to the polycrystalline silicon film, but may be a metal silicide film such as a tungsten silicide film, a titanium silicide film or a cobalt silicide film, also a metal film or a metal compound film such as a tungsten film, a cobalt film, a titanium nitride film, or a tungsten nitride film. It may also be a laminate film of a polycrystalline silicon film with a metal silicide film or a metal film or a metal compound film.

Typical effects brought forth by the inventions disclosed in the present application are briefly as follows.

(1) The film thickness of the polycrystalline silicon film applied to the capacitor electrode film, inclusive of the granular silicon portions (rugged portions), can be controlled.
(2) The height of the granular silicon (ruggedness) of the surface of the polycrystalline silicon film can be controlled easily.
(3) Conductivity of the lower electrode can be secured by preventing the increase of the resistance of the polycrystalline silicon film applied to the capacitor lower electrode.
(4) The drop of the storing capacity due to depletion can be suppressed by preventing the occurrence of the depletion layer (depletion) of the polycrystalline silicon film in the interface between the polycrystalline silicon film and the capacitance insulating film constituting the capacitor lower electrode.

What is claimed is:

1. A semiconductor device, comprising:
   a semiconductor substrate;
   a MISFET formed on a main plane of said substrate; and
   an information storing capacitance device, which includes
      a first electrode electrically connected to a semiconductor region functioning as
      a source or a drain of said MISFET;
      a second electrode so formed as to oppose said first electrode; and
      a capacitance insulating film sandwiched between said first and second electrodes,
      wherein said first electrode includes a first silicon film and a second silicon film forming an interface with the first silicon film and formed on the surface of said first silicon film and having a granular body,
      wherein an impurity concentration of said second silicon film is lower than that of said first silicon film, and
      wherein an inhibitor for inhibiting migration of silicon atoms is disposed in the interface between said first silicon film and said second silicon film.

2. A semiconductor device according to claim 1, wherein said inhibitor is a silicon oxide film formed on the surface of said first silicon film.

3. A semiconductor device according to claim 1, wherein an orientation of the crystal plane of said first silicon film is different from an orientation of the crystal plane of said second silicon film.

4. A semiconductor device according to claim 1, wherein said first silicon film has a film thickness of from 20 to 100 nm.

5. A semiconductor device according to claim 1, wherein the first silicon film has an impurity contained therein, a concentration of the impurity contained in said first silicon film being from $1 \times 10^{20}$ to $1 \times 10^{22}$ atoms/cm$^3$.

6. A semiconductor device according to claim 1, wherein the second silicon film has an impurity contained therein, a concentration of the impurity contained in said second silicon film being not higher than $5.0 \times 10^{20}$ atoms/cm$^3$.

7. A semiconductor device according to claim 1, wherein said second silicon film does not extend continuously, and the granular body has grains adhering to the first silicon film.

8. A semiconductor device according to claim 1, wherein the granular body directly contacts the inhibitor.

9. A semiconductor device according to claim 1, wherein the inhibitor forms islands.

10. A semiconductor device, comprising:
    a semiconductor substrate;
    a MISFET formed on a main plane of said substrate; and
    an information storing capacitance device which includes:
       a first electrode electrically connected to a semiconductor region functioning as
       a source or a drain of said MISFET;
       a second electrode so formed as to oppose said first electrode; and
       a capacitance insulating film sandwiched between said first and second electrodes,
       wherein said first electrode includes a first silicon film and a second silicon film forming an interface with the first silicon film and formed on the surface of said first silicon film and having a granular body,
       wherein an impurity concentration of said second silicon film is lower than that of said first silicon film, and
       wherein a silicon oxide film is disposed in the interface between said first silicon film and said second silicon film.

11. A semiconductor device according to claim 10, wherein said silicon oxide film has a film thickness that is not greater than 2 nm.

12. A semiconductor device according to claim 10, wherein said silicon oxide film is a natural oxide film of silicon that is formed by exposing the surface of a silicon film, that is to serve as said first silicon film, to an oxygen-containing atmosphere after said silicon film is formed.

13. A semiconductor device according to claim 10, wherein said first silicon film hasp flat surface.

14. A semiconductor device according to claim 13, wherein said first silicon film has a surface coarseness that is not greater than 10% of the thickness of the first silicon film.

15. A semiconductor device, comprising:
    a semiconductor substrate;
    a MISFET formed on a main plane of said substrate; and
    an information storing capacitance device which includes:
       a first electrode electrically connected to a semiconductor region functioning as
       a source or a drain of said MISFET;
       a second electrode so formed as to oppose said first electrode; and
       a capacitance insulating film sandwiched between said first and second electrodes, wherein first electrode has a conductor film, and a silicon film having a granular body is formed on the surface of said conductor film, wherein an impurity concentration of said silicon film is lower than that of said conductor film, and wherein a silicon oxide film is disposed in the interface between said conductor film and said silicon film.

16. A semiconductor device according to claim 15, wherein said conductor film is a conductor film selected from the group consisting of a polycrystalline silicon film, a metal silicide film, a laminate film of the polycrystalline silicon film with the metal silicide film or with a metal film, a metal film and a metal compound film.

17. A semiconductor device according to claim 16, wherein said metal silicide film is a metal silicide film selected from the group consisting of a tungsten silicide film, a titanium silicide film and a cobalt silicide film, and said metal film or said metal compound film is a metal film or a metal compound film selected from the group consisting of a tungsten film, a titanium film, a cobalt film, a titanium nitride film and a tungsten nitride film.

18. A semiconductor device, comprising:
a first insulating film formed on a semiconductor substrate;
a second insulating film formed on said first insulating film and having a plurality of openings reaching said first insulating film;
a silicon film formed on a side wall of said openings and on said first insulating film;
a plurality of silicon grains formed on said silicon film;
a dielectric film formed along surfaces of said silicon film and said silicon grains; and
a conductor layer formed on said dielectric film,
wherein an impurity concentration of said plurality of silicon grains is lower than that of said silicon film,
wherein an inhibitor for inhibiting migration of silicon atoms is disposed in the interface between said plurality of silicon grains and said silicon film, and
wherein said silicon film has a substantially equal film thickness at portions thereof having said silicon grains and at portions not having said silicon grains.

19. A semiconductor device according to claim 18, wherein said inhibitor is a silicon oxide film interposed between said silicon film and said silicon grains.

20. A semiconductor device, comprising:
a first insulating film formed on a semiconductor substrate and having a plurality of openings;
a first electrode formed along a side wall of said openings;
a dielectric film formed on said first electrode; and
a second electrode formed on said dielectric film,
wherein said first electrode includes a silicon film formed along the side wall of said openings and silicon grains formed on the surface of said silicon film,
wherein an impurity concentration of said silicon grains is lower than that of said silicon film,
wherein a silicon oxide film is disposed in the interface between said silicon grains and said silicon film, and
wherein said silicon film has a substantially equal film thickness along the side wall of said openings.

21. A semiconductor device according to claim 20, wherein said dielectric film and said second electrode are formed along the side wall of said openings.

22. A semiconductor device according to claim 21, wherein said first electrode, said dielectric film and said second electrode together constitute a capacitance device.

23. A semiconductor device according to claim 22, wherein said first electrode is formed selectively inside each of said openings, and said dielectric film and said second electrode extend also on said first insulating film inside said openings and between said openings.

24. A semiconductor device, comprising:
a first insulating film formed on a semiconductor substrate and having a plurality of openings;
a first electrode formed along a side wall of said openings;
a dielectric film formed on said first electrode; and
a second electrode formed on said dielectric film,
wherein said first electrode comprises a silicon film formed along the side wall of said openings, silicon grains formed on the surface of said first silicon film and a second insulating film formed between said silicon film and said silicon grains, and
wherein an impurity concentration of said silicon grains is lower than that of said silicon film.

25. A semiconductor device according to claim 24, wherein said second insulating film is a silicon oxide film.

* * * * *